(12) United States Patent
Komo et al.

(10) Patent No.: US 11,152,287 B2
(45) Date of Patent: Oct. 19, 2021

(54) SEMICONDUCTOR MODULE AND SEMICONDUCTOR DEVICE

(71) Applicant: Mitsubishi Electric Corporation, Tokyo (JP)

(72) Inventors: Hideo Komo, Tokyo (JP); Arata Iizuka, Tokyo (JP); Takeshi Omaru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/340,156

(22) PCT Filed: Nov. 8, 2016

(86) PCT No.: PCT/JP2016/083045
§ 371 (c)(1),
(2) Date: Apr. 8, 2019

(87) PCT Pub. No.: WO2018/087800
PCT Pub. Date: May 17, 2018

(65) Prior Publication Data
US 2019/0252300 A1    Aug. 15, 2019

(51) Int. Cl.
*H01L 23/495*    (2006.01)
*H01L 23/00*    (2006.01)
(Continued)

(52) U.S. Cl.
CPC ........ *H01L 23/49537* (2013.01); *H01L 23/36* (2013.01); *H01L 23/48* (2013.01);
(Continued)

(58) Field of Classification Search
CPC ............. H01L 25/115; H01L 23/49541; H01L 23/49548; H01L 23/49562;
(Continued)

(56) References Cited

U.S. PATENT DOCUMENTS 5,397,717 A * 3/1995 Davis .................. H01L 29/1608
438/274
2004/0040327 A1    3/2004 Iida et al.
(Continued)

FOREIGN PATENT DOCUMENTS

JP    H11307720 A    11/1999
JP    2002064168 A    2/2002
(Continued)

OTHER PUBLICATIONS

International Search Report issued in PCT/JP2016/083045; dated Jan. 24, 2017.
(Continued)

*Primary Examiner* — Kenneth Parker
*Assistant Examiner* — John Lin
(74) *Attorney, Agent, or Firm* — Studebaker & Brackett PC

(57) ABSTRACT

The present invention is intended to provide a semiconductor module and a semiconductor device that are compatible with various rated currents. A semiconductor module includes a lead frame, and a semiconductor element joined with the lead frame. The lead frame includes a first joining structure and a second joining structure. The first joining structure includes a void part as a part at which the lead frame does not exist, and the second joining structure includes a void part as a part at which the lead frame does not exist. Each of the first joining structure and the second joining structure has a shape such that one of the first joining structure and the second joining structure complements at least part of the void part of the other assuming that the first joining structure and the second joining structure are overlapped.

16 Claims, 18 Drawing Sheets

(51) Int. Cl.
*H01L 25/07* (2006.01)
*H01L 23/36* (2006.01)
*H01L 23/48* (2006.01)
*H01L 25/18* (2006.01)
*H01L 23/31* (2006.01)

(52) U.S. Cl.
CPC .. *H01L 23/49548* (2013.01); *H01L 23/49568* (2013.01); *H01L 23/49575* (2013.01); *H01L 24/32* (2013.01); *H01L 25/07* (2013.01); *H01L 25/072* (2013.01); *H01L 25/18* (2013.01); *H01L 23/3107* (2013.01); *H01L 23/49562* (2013.01); *H01L 2224/32245* (2013.01); *H01L 2924/1033* (2013.01); *H01L 2924/10254* (2013.01); *H01L 2924/10272* (2013.01); *H01L 2924/13055* (2013.01); *H01L 2924/13091* (2013.01)

(58) Field of Classification Search
CPC ......... H01L 23/19838; H01L 23/19844; H01L 25/072; H01L 2924/10272; H01L 2924/1033; H01L 2924/10254; H01L 2924/13091; H01L 2924/13055; H01L 23/49838; H01L 23/49844; H01L 23/49568; H01L 23/3107
See application file for complete search history.

(56) References Cited

U.S. PATENT DOCUMENTS

| | | |
|---|---|---|
| 2012/0112332 A1 | 5/2012 | Minamio et al. |
| 2015/0380384 A1* | 12/2015 | Williams .......... H01L 23/49555 438/112 |
| 2016/0035657 A1* | 2/2016 | Tomioka ............... H01L 21/561 257/693 |

FOREIGN PATENT DOCUMENTS

| | | |
|---|---|---|
| JP | 2002184940 A | 6/2002 |
| JP | 2003023280 A | 1/2003 |
| JP | 2004158757 A | 6/2004 |
| JP | 2014183078 A | 9/2014 |
| WO | 2011/155165 A1 | 12/2011 |

OTHER PUBLICATIONS

An Office Action mailed by the Japanese Patent Office dated Sep. 3, 2019, which corresponds to Japanese Patent Application No. 2018-549646 and is related to U.S. Appl. No. 16/340,156; with English translation.

* cited by examiner

SEMICONDUCTOR MODULE AND SEMICONDUCTOR DEVICE

TECHNICAL FIELD

The present invention relates to a semiconductor module and a semiconductor device.

BACKGROUND ART

A semiconductor module in which a semiconductor element as a switching element is joined on a lead frame and controlled to turn on and off to convert electrical power has been known (refer to Patent Document 1, for example).

When conventional semiconductor modules having different rated currents are to be manufactured, it is necessary to design a member such as the lead frame dedicated for each semiconductor module. Since dedicated members has to be designed for each of different rated currents, there have been problems such as an increase in development cost and manufacturing cost and an increase in the development period. The rated current is a current value determined in accordance with the specifications of each semiconductor module.

PRIOR ART DOCUMENTS

Patent Documents

Patent Document 1: WO 2011/155165

SUMMARY

Problem to be Solved by the Invention

As described above, the conventional semiconductor module requires dedicated design of members for each of different rated currents, and thus the members cannot be standardized, resulting in problems such as an increase in development cost and manufacturing cost, and an increase in the development period. In addition, there is a problem of complication of the process of manufacturing semiconductor modules having a plurality of rated currents.

The present invention has been made to solve the above-described problems, and it is an object of the present invention to provide a semiconductor module and a semiconductor device that are compatible with various rated currents.

Means to Solve the Problem

A semiconductor module according to the present invention includes: a lead frame; and a semiconductor element joined with the lead frame. The lead frame includes a first joining structure and a second joining structure. The first joining structure is disposed on a first side of the lead frame, and the second joining structure is disposed on a second side of the lead frame facing to the first side. The first joining structure includes a void part as a part at which the lead frame does not exist, and the second joining structure includes a void part as a part at which the lead frame does not exist. Each of the first joining structure and the second joining structure has a shape such that one of the first joining structure and the second joining structure complements at least part of the void part of the other assuming that the first joining structure and the second joining structure are overlapped.

Effects of the Invention

A semiconductor module according to the present invention includes a first joining structure and a second joining structure, and thus an optional number of semiconductor modules can be coupled with each other in line. Specifically, the plurality of semiconductor modules can be connected in parallel with each other, and thus the rated current value of the plurality of coupled semiconductor modules as a whole can be changed in accordance with the number of the coupled semiconductor modules.

Accordingly, semiconductor modules are not needed to be exclusively designed for each of different rated current values, and thus can be commonly used. As a result, development cost and manufacturing cost can be reduced. In addition, the manufacturing process can be simplified.

These and other objects, features, aspects and advantages of the present invention will become more apparent from the following detailed description of the present invention in conjunction with the accompanying drawings.

DESCRIPTION OF EMBODIMENTS

<First Embodiment>

Figure 1:
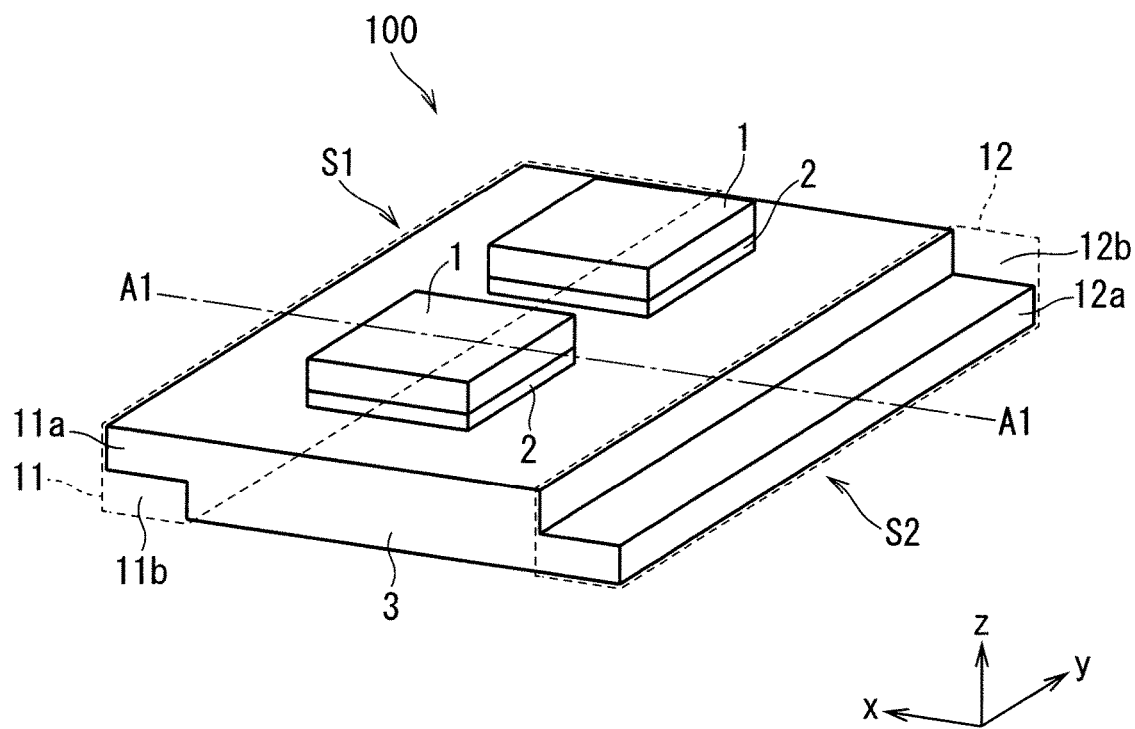
FIG. 1 is a perspective view of a semiconductor module according to a first embodiment.
Figure 2:
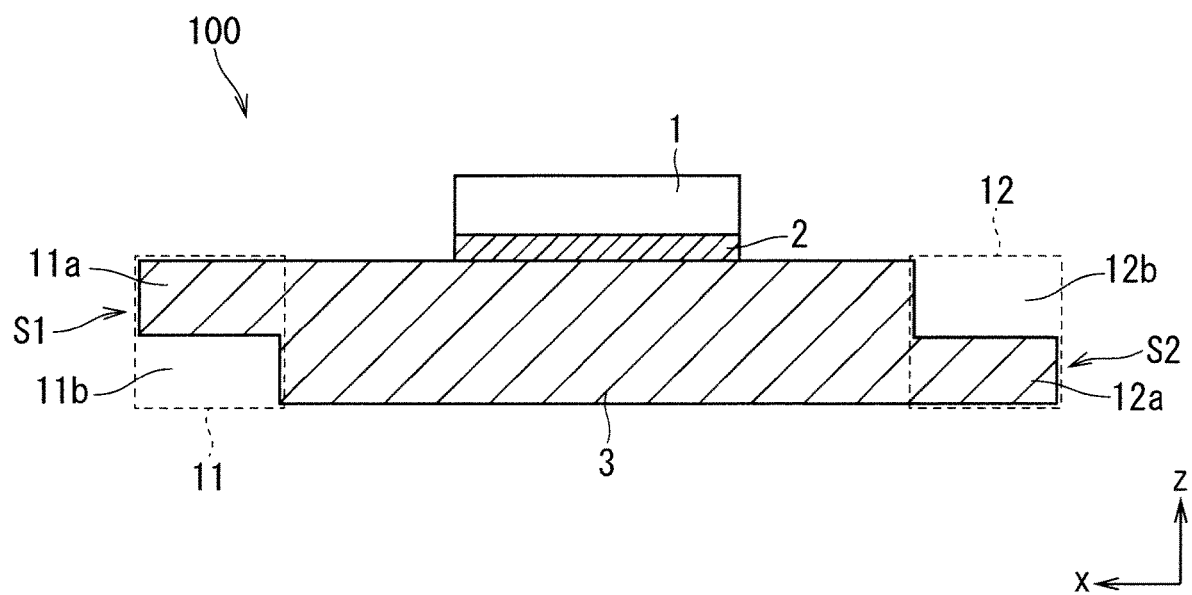
FIG. 2 is a cross-sectional view of the semiconductor module according to the first embodiment.

FIG. 1 is a perspective view of a semiconductor module 100 according to a first embodiment. FIG. 2 is a cross-sectional view of the semiconductor module 100 taken along line A1-A1 in FIG. 1. As illustrated in FIGS. 1 and 2, the semiconductor module 100 includes a lead frame 3 and a semiconductor element 1 joined with the lead frame 3.

The semiconductor element 1 is joined with the lead frame 3 by solder 2, for example. The semiconductor element 1 is a power semiconductor element. The semiconductor element 1 is a switching element such as an insulated gate bipolar transistor (IGBT) or a metal-oxide-semiconductor field-effect transistor (MOSFET). The semiconductor element 1 may be a free wheel diode. The semiconductor element 1 may contain a wide-bandgap semiconductor such as SiC, GaN, or diamond.

Upper and lower surfaces (which are surfaces on the +z direction side and the −z direction side) of the semiconductor element 1 are each provided with a main electrode. In addition, a control electrode is provided, for example, on part of the upper surface of the semiconductor element 1.

The conductive lead frame 3 is formed of, for example, copper or aluminum. The lead frame 3 may be made of an alloy containing copper or aluminum as a main component. As illustrated in FIGS. 1 and 2, a side on the +x direction side of the lead frame 3 is defined as a first side S1. A side on the −x direction side of the lead frame 3 is defined as a second side S2. The first side S1 and the second side S2 face to each other.

The lead frame 3 includes a first joining structure 11 and a second joining structure 12. The first joining structure 11 is disposed on the first side S1 of the lead frame 3. The second joining structure 12 is disposed on a second side S2 of the lead frame 3. The first joining structure 11 includes a substantial part 11a at which the lead frame 3 exists and a void part 11b in which the lead frame 3 does not exist. The second joining structure 12 includes a substantial part 12a at which the lead frame 3 exists and a void part 12b at which the lead frame 3 does not exist.

Assuming that the first joining structure 11 and the second joining structure 12 are overlapped, each of the first joining structure 11 and the second joining structure 12 has a shape such that one of the first joining structure 11 and the second joining structure 12 complements at least part of the void part 11b or 12b of the other. In other words, in FIG. 2, assuming that the second joining structure 12 is moved in parallel in the x direction and overlapped with the first joining structure 11, the substantial part 11a of the first joining structure 11 complements the void part 12b of the second joining structure 12, and the substantial part 12a of the second joining structure 12 complements the void part 11b of the first joining structure 11.

The semiconductor module 100 may further include an insulating member 4 as described in a fifth embodiment. The semiconductor module 100 may further include a cooler 5 as described in a modification of the fifth embodiment. An electrode terminal 6 may be further provided as described in a sixth embodiment. Further, as described in a seventh embodiment, a heat pipe may be incorporated in the lead frame 3. In addition, as described in an eighth embodiment, a sealing resin 15 may be provided for sealing.

Figure 3:
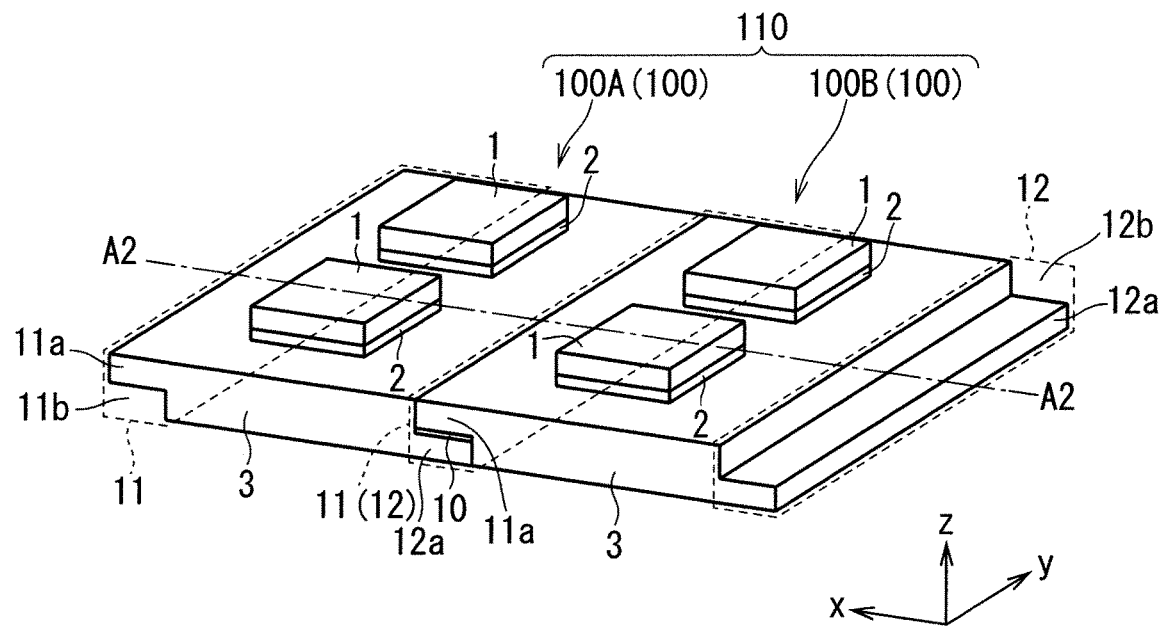
FIG. 3 is a perspective view of a semiconductor device according to the first embodiment.
Figure 4:
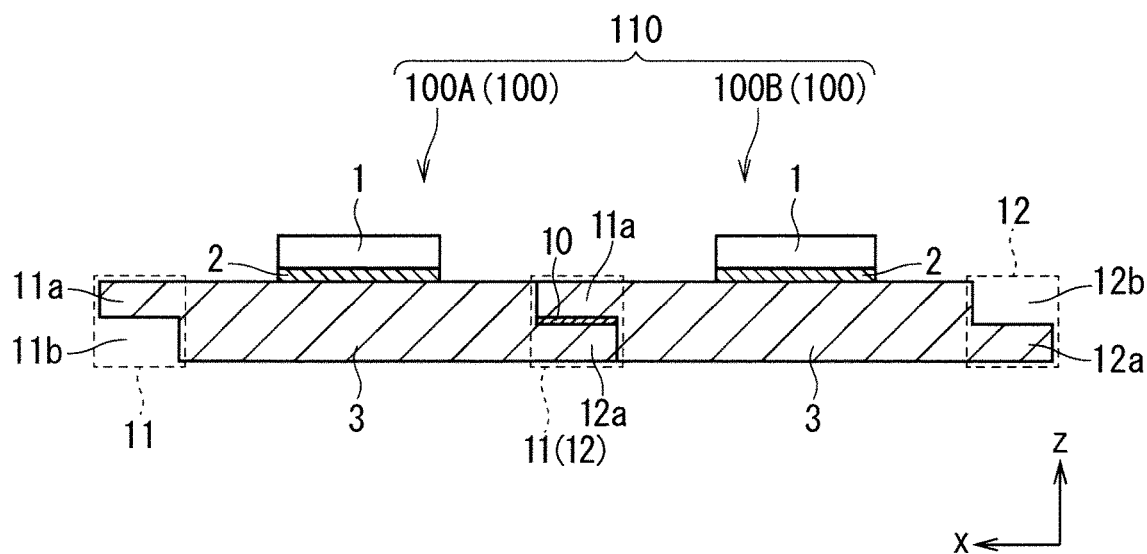
FIG. 4 is a cross-sectional view of the semiconductor device according to the first embodiment.

FIG. 3 is a perspective view of a semiconductor device 110 according to the first embodiment. FIG. 4 is a cross-sectional view of the semiconductor device 110 taken along line A2-A2 in FIG. 3. As illustrated in FIGS. 3 and 4, the semiconductor device 110 has a configuration in which two semiconductor modules 100 are coupled with each other.

For the sake of description, the two semiconductor modules 100 are referred to as semiconductor modules 100A and 100B, respectively, for distinction.

As illustrated in FIGS. 3 and 4, among the semiconductor modules 100A and 100B adjacent to each other, the first side S1 of the semiconductor module 100B and the second side S2 of the semiconductor module 100A face to each other. The first joining structure 11 of the semiconductor module 100B and the second joining structure 12 of the semiconductor module 100A are electrically joined with each other by solder 10.

As illustrated in FIGS. 3 and 4, the semiconductor elements 1 can be connected in parallel with each other by electrically joining the lead frames 3 of the semiconductor modules 100A and 100B to each other. Thus, the rated current value of the semiconductor device 110 can be changed in accordance with the number of the coupled semiconductor modules 100.

The number of semiconductor modules 100 provided in the semiconductor device 110 is not limited to two. An optional number of semiconductor modules 100 can be coupled with each other in the +x direction and −x direction in accordance with the rated current of the semiconductor device 110.

<Effects>

The semiconductor module 100 according to the first embodiment includes the lead frame 3 and the semiconductor element 1 joined with the lead frame 3. The lead frame 3 includes the first joining structure 11 and the second joining structure 12. The first joining structure 11 is disposed on the first side S1 of the lead frame 3, and the second joining structure 12 is disposed on the second side S2 of the lead frame 3 facing to the first side S1. The first joining structure 11 includes the void part 11b as a part at which the lead frame 3 does not exist, and the second joining structure 12 includes the void part 12b as a part at which the lead frame 3 does not exist. Each of the first joining structure 11 and the second joining structure 12 has a shape such that one of the first joining structure 11 and the second joining structure 12 complements at least part of the void part 11b or 12b of the other assuming that the first joining structure 11 and the second joining structure 12 are overlapped.

Since the semiconductor module 100 according to the first embodiment includes the first joining structure 11 and the second joining structure 12, an optional number of semiconductor modules 100 can be coupled with each other in line. Accordingly, since a plurality of semiconductor modules 100 can be connected in parallel with each other, the rated current value of a plurality of coupled semiconductor modules 100 as a whole can be changed in accordance with the number of coupled semiconductor modules 100. In this manner, according to the first embodiment, it is possible to obtain the semiconductor module 100 with which the rated current value of a plurality of coupled semiconductor modules 100 as a whole can be changed in accordance with the number of coupled semiconductor modules 100. Thus, the semiconductor modules 100 do not need to be exclusively designed for each of different rated current values and can be commonly used. As a result, development cost and manufacturing cost can be reduced. In addition, the manufacturing process can be simplified.

Moreover, in the semiconductor module 100 according to the first embodiment, the lead frame 3 contains copper or aluminum. Accordingly, it is possible to improve the thermal conduction efficiency of the lead frame 3.

The semiconductor device 110 according to the first embodiment includes a plurality of semiconductor modules 100. Among the plurality of semiconductor modules 100, the first side S1 of one of the semiconductor modules 100 adjacent to each other is disposed facing to the second side S2 of the other of the semiconductor modules 100 adjacent to each other. The first joining structure 11 of one of the semiconductor modules 100 adjacent to each other is electrically joined with the second joining structure 12 of the other of the semiconductor modules 100 adjacent to each other.

Accordingly, the rated current value of the semiconductor device 110 can be changed by changing the number of coupled semiconductor modules 100, and thus it is not necessary to design the lead frame 3 having a dedicated shape for each of different rated current values, and the semiconductor module 100 can be manufactured at low cost. In addition, the semiconductor device 110 is manufactured by coupling a plurality of semiconductor modules 100 having the same structure, and thus semiconductor devices 110 having various rated current values can be easily manufactured.

In the semiconductor device 110 according to the first embodiment, the first joining structure 11 of one of the semiconductor modules 100 adjacent to each other and the second joining structure 12 of the other of the semiconductor modules 100 adjacent to each other are electrically joined with each other by soldering.

Accordingly, since the first joining structure 11 and the second joining structure 12 of the semiconductor modules 100 adjacent to each other are soldered with each other, excellent current conduction and strong joint can be achieved.

<Modification of First Embodiment>

Figure 5:
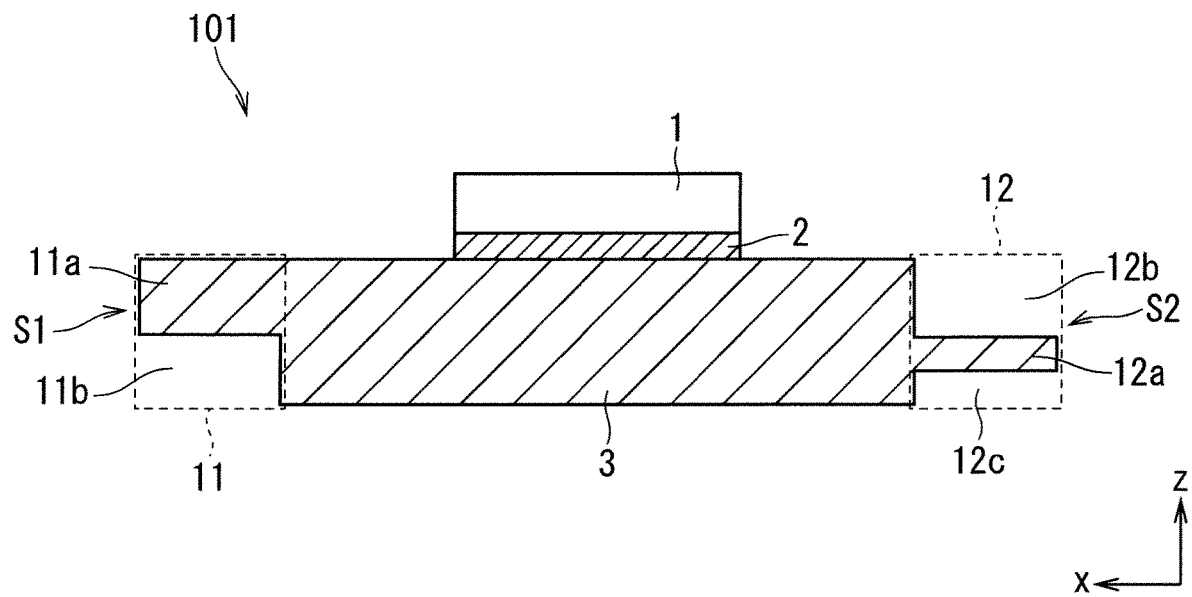
FIG. 5 is a cross-sectional view of a semiconductor module according to a modification of the first embodiment.
Figure 6:
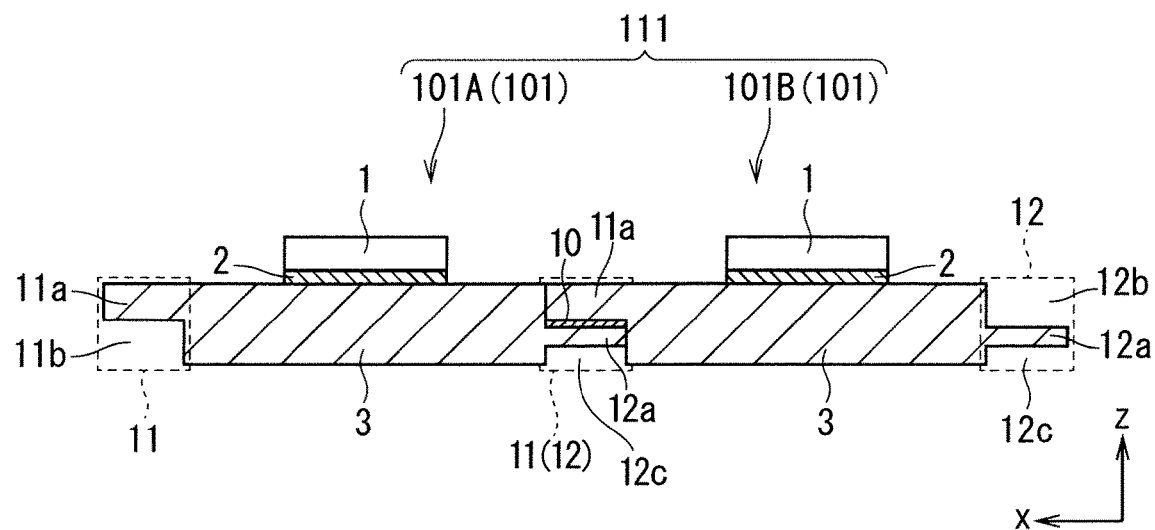
FIG. 6 is a cross-sectional view of the semiconductor device according to the modification of the first embodiment.

FIG. 5 is a cross-sectional view of a semiconductor module 101 according to a modification of the first embodiment. FIG. 6 is a cross-sectional view of a semiconductor device 111 according to the modification of the first embodiment. As illustrated in FIG. 5, the second joining structure 12 of the semiconductor module 101 includes a void part 12c that is not used for joining. In other words, as illustrated in FIG. 6, the void part 12c that is not used for joining is not complemented by the substantial part of the first joining structure 11.

<Second Embodiment>

Figure 7:
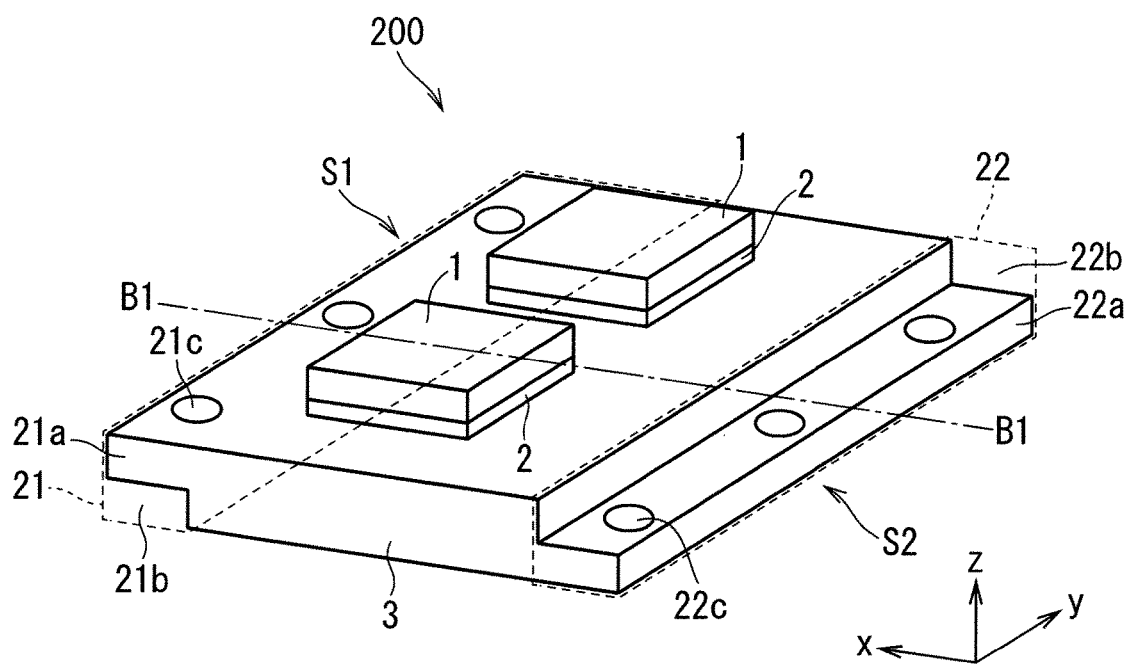
FIG. 7 is a perspective view of a semiconductor module according to a second embodiment.
Figure 8:
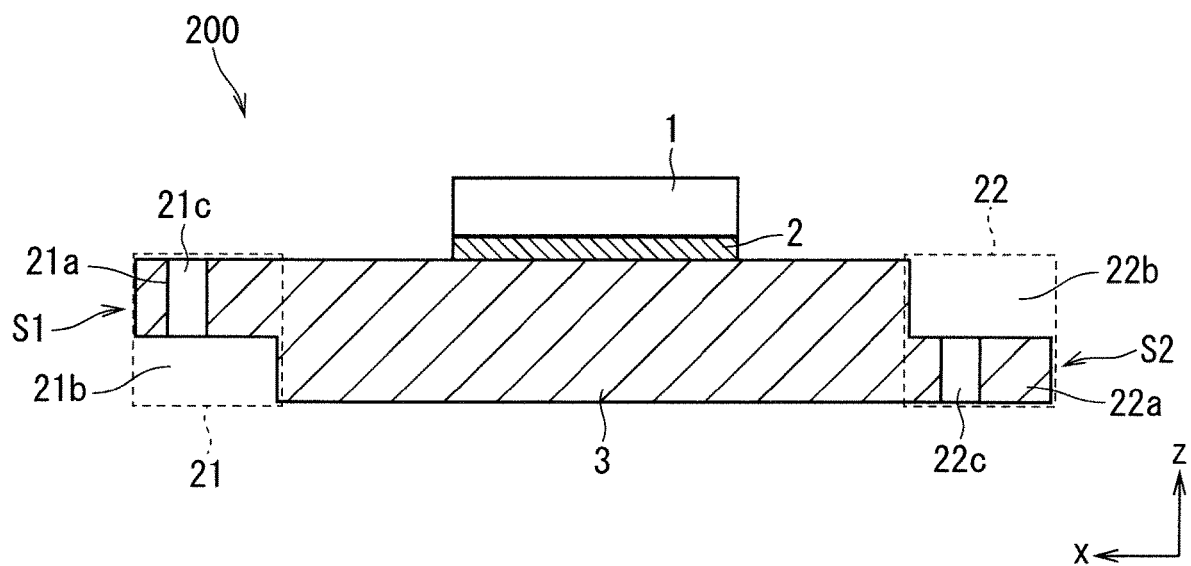
FIG. 8 is a cross-sectional view of the semiconductor module according to the second embodiment.

FIG. 7 is a perspective view of a semiconductor module 200 according to a second embodiment. FIG. 8 is a cross-sectional view of the semiconductor module 200 taken along line B1-B1 in FIG. 7. The semiconductor module 200 has the same configuration as that of the semiconductor module 100 (FIGS. 1 and 2) except for the shapes of the first joining structure 21 and the second joining structure 22.

The lead frame 3 of the semiconductor module 200 includes the first joining structure 21 and the second joining structure 22. The first joining structure 21 is disposed on the first side S1 of the lead frame 3. The second joining structure 22 is disposed on the second side S2 of the lead frame 3. The first joining structure 21 includes a substantial part 21a at which the lead frame 3 exists and a void part 21b at which the lead frame 3 does not exist. The second joining structure 22 includes a substantial part 22a at which the lead frame 3 exists and a void part 22b at which the lead frame 3 does not exist.

In addition, the first joining structure 21 includes a through-hole 21c at the substantial part 21a. The second joining structure 22 includes a hole 22c at the substantial part 22a. A female screw is formed inside the hole 22c.

Each of the first joining structure 21 and the second joining structure 22 has a shape such that one of the first joining structure 21 and the second joining structure 22 complements at least part of the void part 21b or 22b of the other assuming that the first joining structure 21 and the second joining structure 22 are overlapped. In other words, in FIG. 8, assuming that the second joining structure 22 is moved in parallel in the x direction and overlapped with the first joining structure 21, the substantial part 21a of the first joining structure 21 complements the void part 22b of the second joining structure 22, and the substantial part 22a of the second joining structure 22 complements the void part 21b of the first joining structure 21.

In FIG. 8, assuming that the second joining structure 22 is moved in parallel in the x direction and overlapped with the first joining structure 21, the through-hole 21c of the first joining structure 21 and the hole 22c of the second joining structure 22 are disposed in line.

Figure 9:
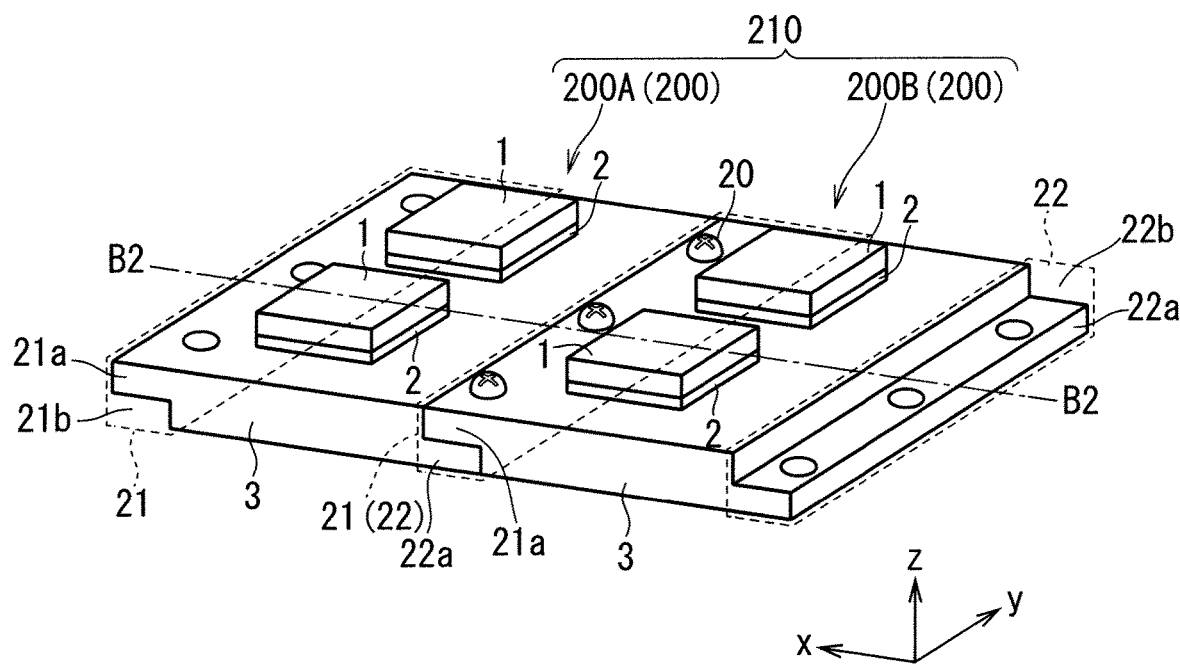
FIG. 9 is a perspective view of a semiconductor device according to the second embodiment.
Figure 10:
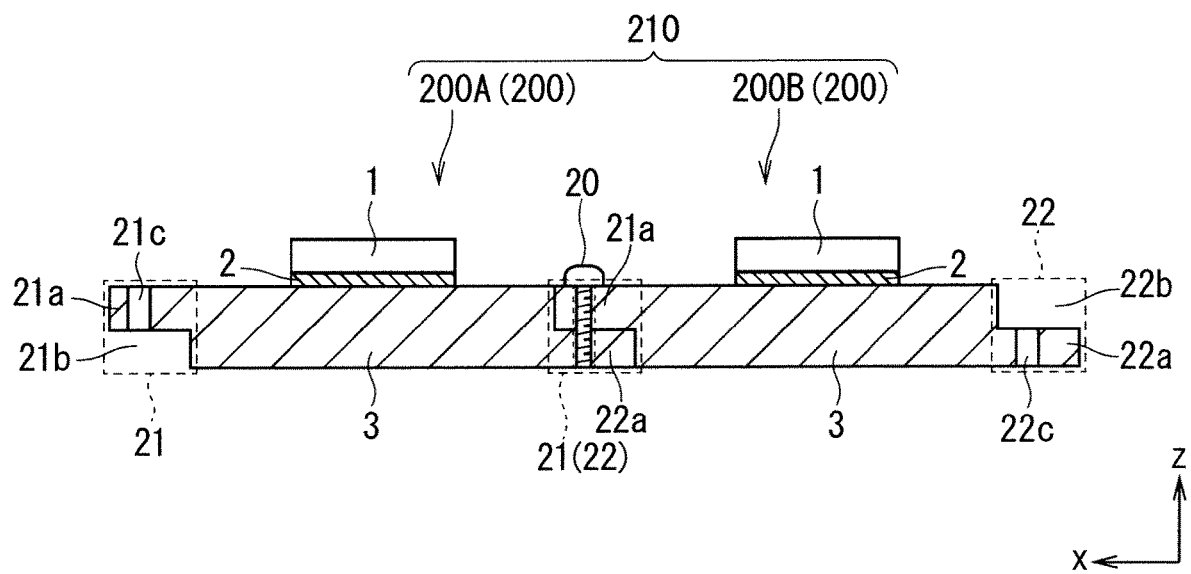
FIG. 10 is a cross-sectional view of the semiconductor device according to the second embodiment.

FIG. 9 is a perspective view of a semiconductor device 210 according to the second embodiment. FIG. 10 is a cross-sectional view of the semiconductor device 210 taken along line B2-B2 in FIG. 9. As illustrated in FIGS. 9 and 10, the semiconductor device 210 has a configuration in which two semiconductor modules 200 are coupled with each other. For the sake of description, the two semiconductor modules 200 are referred to as semiconductor modules 200A and 200B, respectively, for distinction.

As illustrated in FIGS. 9 and 10, among the semiconductor modules 200A and 200B adjacent to each other, the first side S1 of the semiconductor module 200B is disposed facing to the second side S2 of the semiconductor module 200A. The first joining structure 21 of the semiconductor module 200B is electrically joined with the second joining structure 22 of the semiconductor module 200A by screwing.

Accordingly, the through-hole 21c provided in the first joining structure 21 of the semiconductor module 200B and the hole 22c provided in the second joining structure 22 of the semiconductor module 200A are screwed with each other by a screw 20.

As illustrated in FIGS. 9 and 10, the semiconductor elements 1 can be connected in parallel with each other by electrically joining the lead frames 3 of the semiconductor modules 200A and 200B. Accordingly, the rated current value of the semiconductor device 210 can be changed in accordance with the number of the coupled semiconductor modules 200.

The number of semiconductor modules 200 provided in the semiconductor device 210 is not limited to two. An optional number of semiconductor modules 200 can be coupled with each other in the +x direction and −x direction in accordance with the rated current of the semiconductor device 210.

In the semiconductor module 200, no female screw may be formed inside the hole 22c provided in the second joining structure 22, but the hole 22c may be used as a through-hole. In this case, in the semiconductor device 210, the through-hole 21c provided in the first joining structure 21 and the hole 22c provided in the second joining structure 22 are screwed with a bolt and a nut.

<Effects>

In the semiconductor module 200 according to the second embodiment, the first joining structure 21 includes the through-hole 21c and the second joining structure 22 includes the hole 22c. Assuming that the first joining structure 21 and the second joining structure 22 are overlapped, the through-hole 21c and the hole 22c are disposed in line.

Accordingly, the through-hole 21c of the first joining structure 21 of one of the semiconductor modules 200, can be joined with the hole 22c of the second joining structure 22 of the other semiconductor module 200 adjacent thereto through a rod-shaped member such as a screw.

In the semiconductor device 210 according to the second embodiment, the first joining structure 21 of one of the semiconductor modules 200 adjacent to each other and the second joining structure 22 of the other of the semiconductor modules 200 adjacent to each other are screwed and electrically joined with each other.

The first joining structure 21 and the second joining structure 22 of the semiconductor modules 200 adjacent to each other can be easily joined with each other by screwing.

<Third Embodiment>

Figure 11:
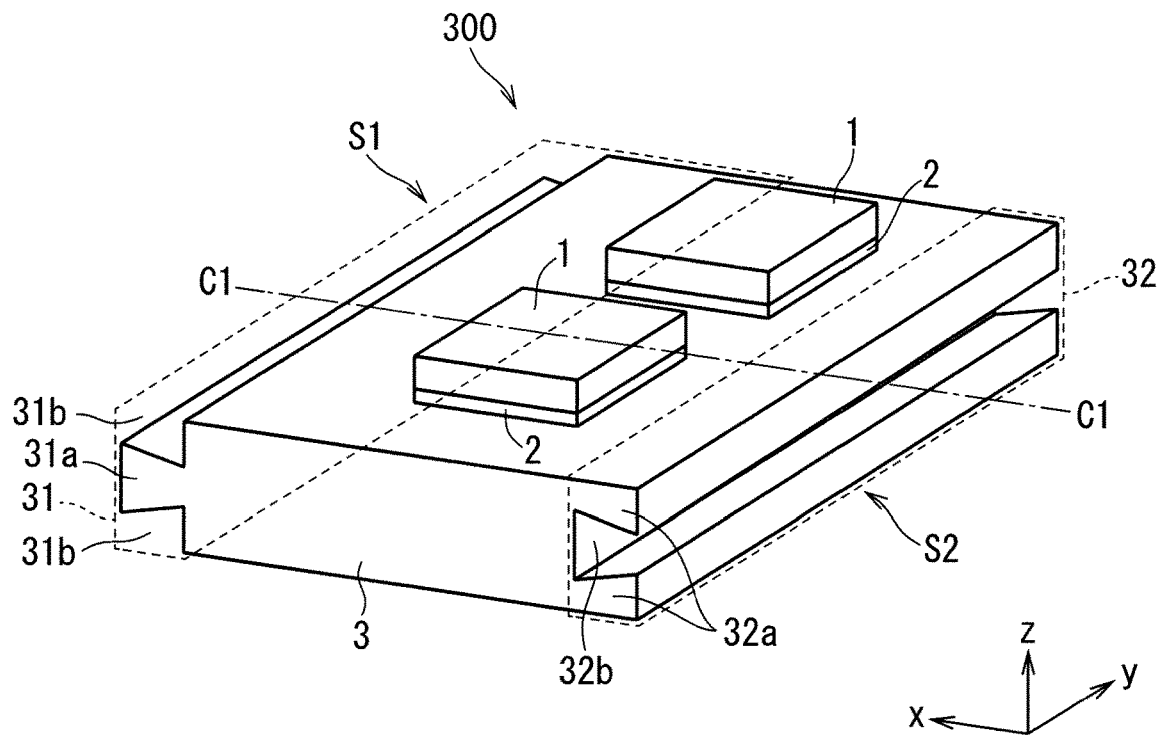
FIG. 11 is a perspective view of a semiconductor module according to a third embodiment.
Figure 12:
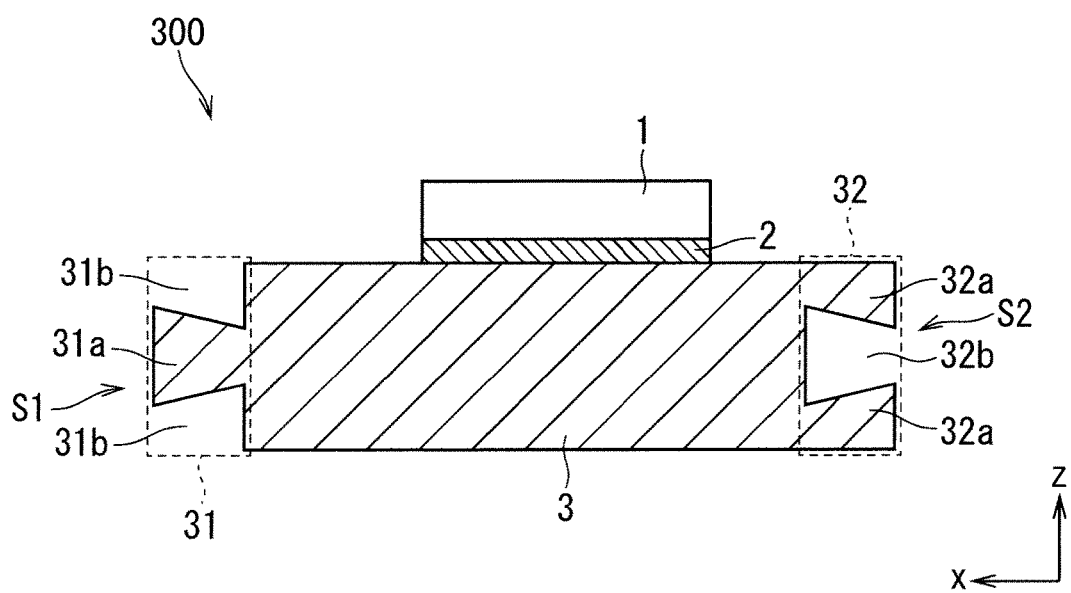
FIG. 12 is a cross-sectional view of the semiconductor module according to the third embodiment.

FIG. 11 is a perspective view of a semiconductor module 300 according to a third embodiment. FIG. 12 is a cross-sectional view of the semiconductor module 300 taken along line C1-C1 in FIG. 11. The semiconductor module 300 has the same configuration as that of the semiconductor module 100 (FIGS. 1 and 2) except for the shapes of a first joining structure 31 and a second joining structure 32.

The lead frame 3 of the semiconductor module 300 includes the first joining structure 31 and the second joining structure 32. The first joining structure 31 is disposed on the first side S1 of the lead frame 3. The second joining structure 32 is disposed on the second side S2 of the lead frame 3. The first joining structure 31 includes a substantial part 31a at which the lead frame 3 exists and a void part 31b at which the lead frame 3 does not exist. The second joining structure 32 includes a substantial part 32a at which the lead frame 3 exists and a void part 32b at which the lead frame 3 does not exist.

In the third embodiment, the first joining structure 31 includes a male joint. The second joining structure 32 includes a female joint. As illustrated in FIGS. 11 and 12, each joint is an ant-shaped joint, for example. The ant-shaped joint is also called a dovetail joint.

Each of the first joining structure 31 and the second joining structure 32 has a shape such that one of the first joining structure 31 and the second joining structure 32 complements at least part of the void part 31b or 32b of the other assuming that the first joining structure 31 and the second joining structure 32 are overlapped. In other words, in FIG. 12, assuming that the second joining structure 32 is moved in parallel in the x direction and overlapped with the first joining structure 31, the substantial part 31a of the first joining structure 31 complements the void part 32b of the second joining structure 32, and the substantial part 32a of the second joining structure 32 complements the void part 31b of the first joining structure 31.

In the third embodiment, assuming that the second joining structure 32 is moved in parallel in the x direction and overlapped with the first joining structure 31, the male joint of the first joining structure 31 and the female joint of the second joining structure 32 are fitted to each other.

Figure 13:
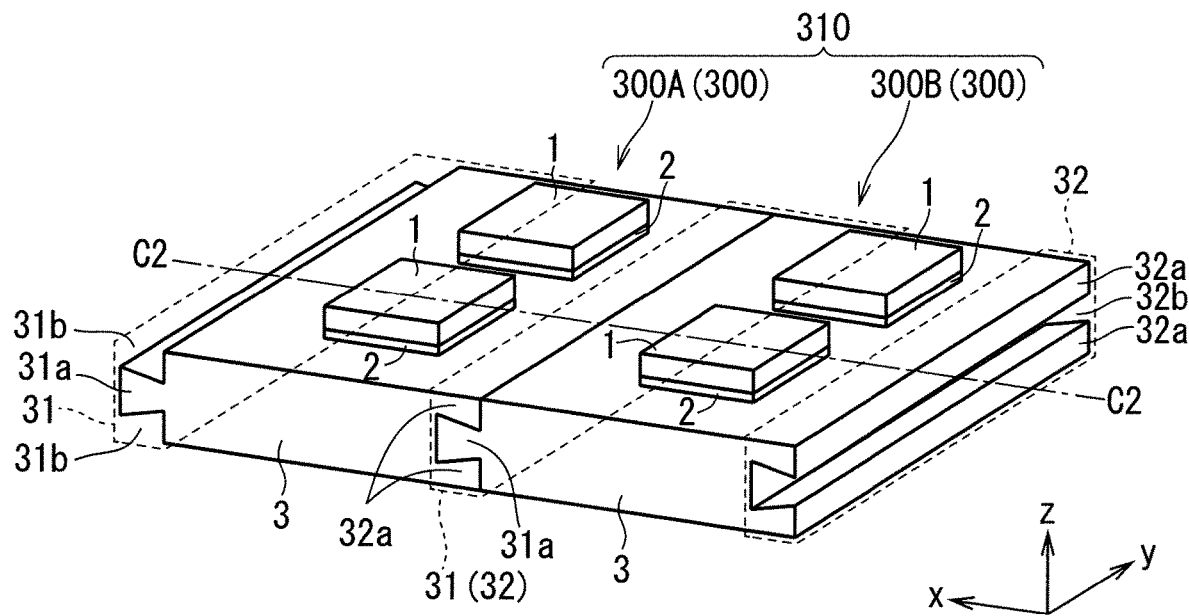
FIG. 13 is a perspective view of a semiconductor device according to the third embodiment.
Figure 14:
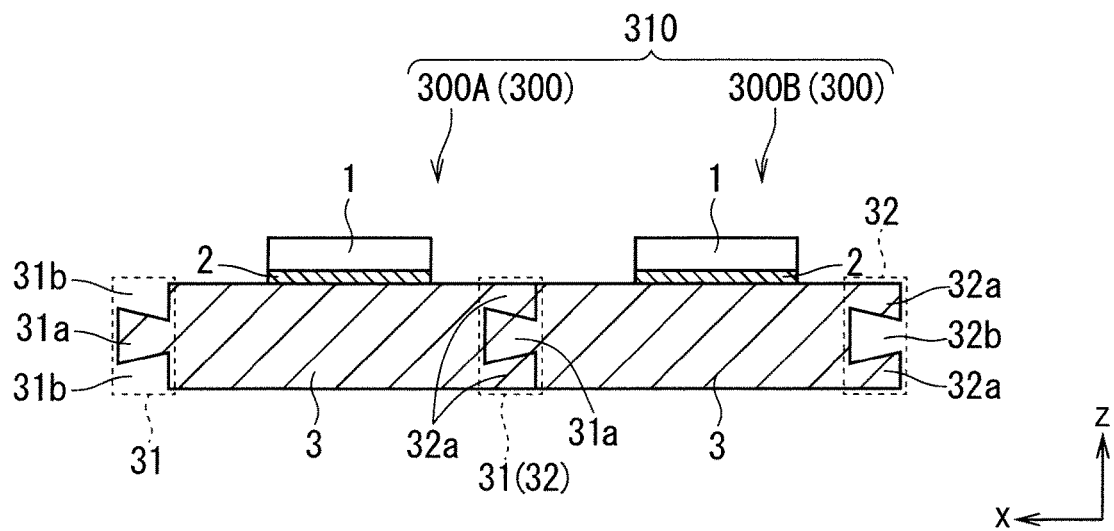
FIG. 14 is a cross-sectional view of the semiconductor device according to the third embodiment.

FIG. 13 is a perspective view of a semiconductor device 310 according to the third embodiment. FIG. 14 is a cross-sectional view of the semiconductor device 310 taken along line C2-C2 in FIG. 13. As illustrated in FIGS. 13 and 14, the semiconductor device 310 has a configuration in which two semiconductor modules 300 are coupled with each other. For the sake of description, the two semiconductor modules 300 are referred to as semiconductor modules 300A and 300B, respectively, for distinction.

As illustrated in FIGS. 13 and 14, among the semiconductor modules 300A and 300B adjacent to each other, the first side S1 of the semiconductor module 300B is disposed facing to the second side S2 of the semiconductor module 300A. The first joining structure 31 of the semiconductor module 300B and the second joining structure 32 of the semiconductor module 300A are electrically joined with each other by fitting.

In other words, the male joint provided in the first joining structure 31 of the semiconductor module 300B and the female joint provided in the second joining structure 32 of the semiconductor module 300A are fitted with each other. The semiconductor module 300B is slid in the y direction with respect to the semiconductor module 300A to fit the male joint and the female joint to each other.

As illustrated in FIGS. 13 and 14, the semiconductor elements 1 can be connected in parallel with each other by electrically joining the lead frames 3 of the semiconductor modules 300A and 300B with each other. Accordingly, the rated current value of the semiconductor device 310 can be changed in accordance with the number of the coupled semiconductor modules 300.

The number of semiconductor modules 300 provided in the semiconductor device 310 is not limited to two. An optional number of semiconductor modules 300 can be coupled with each other in the +x direction and −x direction in accordance with the rated current of the semiconductor device 310.

<Effects>

In the semiconductor module 300 according to the third embodiment, the first joining structure 31 includes the male joint, and the second joining structure 32 includes the female joint. Assuming that the first joining structure 31 and the second joining structure 32 are overlapped, the male joint and the female joint are fitted to each other.

Accordingly, it is possible to join the first joining structure 31 and the second joining structure 22 of the semiconductor modules 300 adjacent to each other by fitting the male joint and the female joint to each other.

In the semiconductor module 300 according to the third embodiment, the male joint and the female joint are ant-shaped joints.

Accordingly, the lead frames 3 of semiconductor modules 300 adjacent to each other can be integrated with each other to achieve high strength by using the ant-shaped joints.

In the semiconductor device 310 according to the third embodiment, the first joining structure 31 of one of the semiconductor modules 300 adjacent to each other and the second joining structure 32 of the other of the semiconductor modules 300 adjacent to each other are electrically joined with each other by fitting.

The first joining structure 31 and the second joining structure 32 of the respective semiconductor modules 300 adjacent to each other can be joined with each other by fitting without using a joining member such as solder or a screw.

<Fourth Embodiment>

Figure 15:
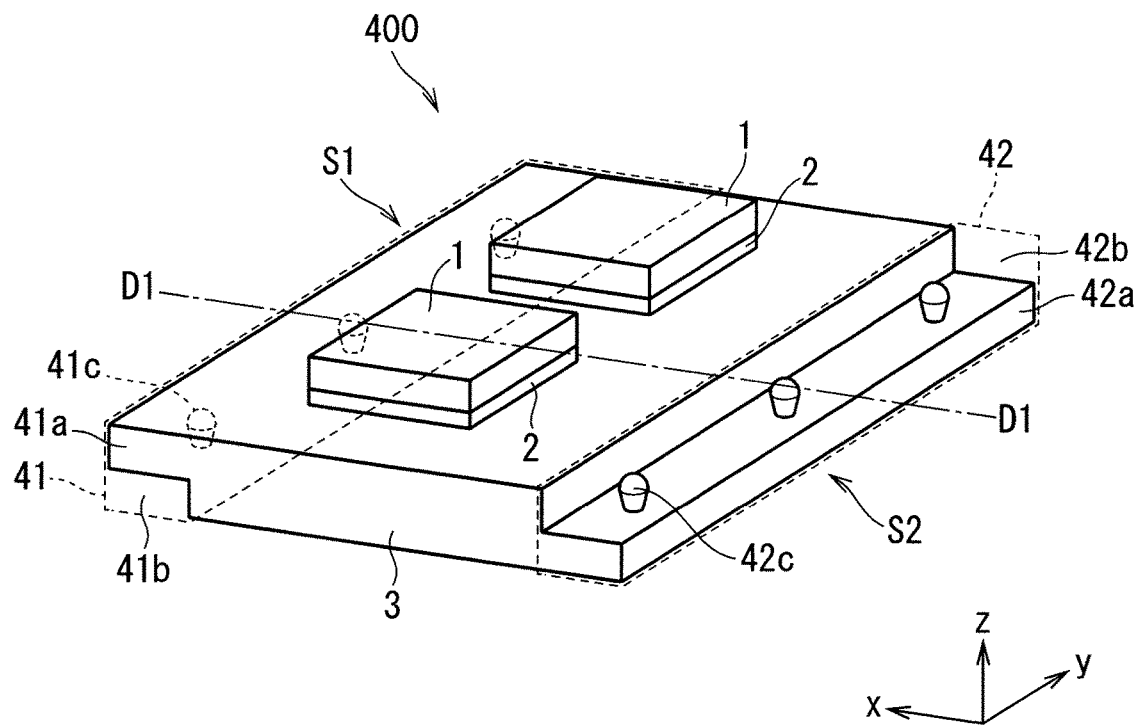
FIG. 15 is a perspective view of a semiconductor module according to a fourth embodiment.
Figure 16:
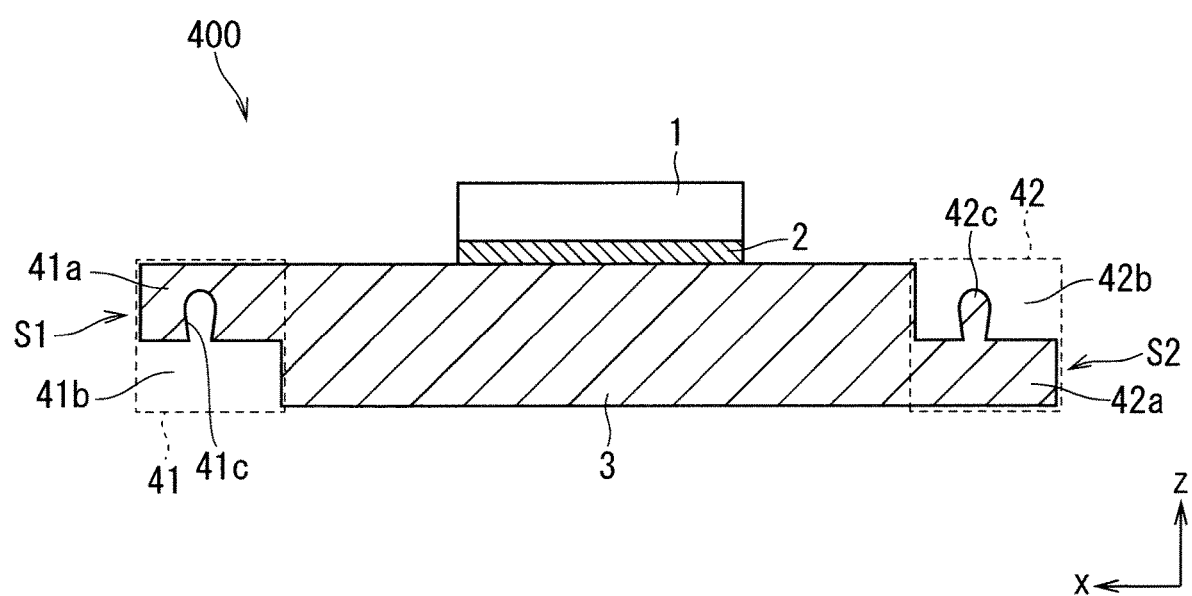
FIG. 16 is a cross-sectional view of the semiconductor module according to the fourth embodiment.

FIG. 15 is a perspective view of a semiconductor module 400 according to a fourth embodiment. FIG. 16 is a cross-sectional view of the semiconductor module 400 taken along line D1-D1 in FIG. 15. The semiconductor module 400 has the same configuration as that of the semiconductor module 100 (FIGS. 1 and 2) except for the shapes of a first joining structure 41 and a second joining structure 42.

The lead frame 3 of the semiconductor module 400 includes the first joining structure 41 and the second joining structure 42. The first joining structure 41 is disposed on the first side S1 of the lead frame 3. The second joining structure 42 is disposed on the second side S2 of the lead frame 3. The first joining structure 41 includes a substantial part 41a at which the lead frame 3 exists and a void part 41b at which the lead frame 3 does not exist. The second joining structure 42 includes a substantial part 42a at which the lead frame 3 exists, and a void part 42b at which the lead frame 3 does not exist.

In addition, the first joining structure 41 includes a plurality of concave parts 41c in the substantial part 41a. Each concave part 41c is recessed in a direction perpendicular to the main surface of the lead frame 3 (the z direction). The second joining structure 42 includes a plurality of convex parts 42c in the substantial part 42a. Each convex part 42c protrudes in the direction perpendicular to the main surface of the lead frame 3 (the z direction). The convex part 42c is thicker at the head than at the base. The concave part 41c is wider at the inside than the entrance.

Each of the first joining structure 41 and the second joining structure 42 has a shape such that one of the first joining structure 41 and the second joining structure 42 complements at least part of the void part 41b or 42b of the other assuming that the first joining structure 41 and the second joining structure 42 are overlapped. In other words, in FIG. 16, assuming that the second joining structure 42 is moved in parallel in the x direction and overlapped with the first joining structure 41, the substantial part 41a of the first joining structure 41 complements the void part 42b of the second joining structure 42, and the substantial part 42a of the second joining structure 42 complements the void part 41b of the first joining structure 41.

In the fourth embodiment, assuming that the second joining structure 42 is moved in parallel in the x direction and overlapped with the first joining structure 41, the concave part 41c of the first joining structure 41 and the convex part 42c of the second joining structure 42 are fitted to each other.

Figure 17:
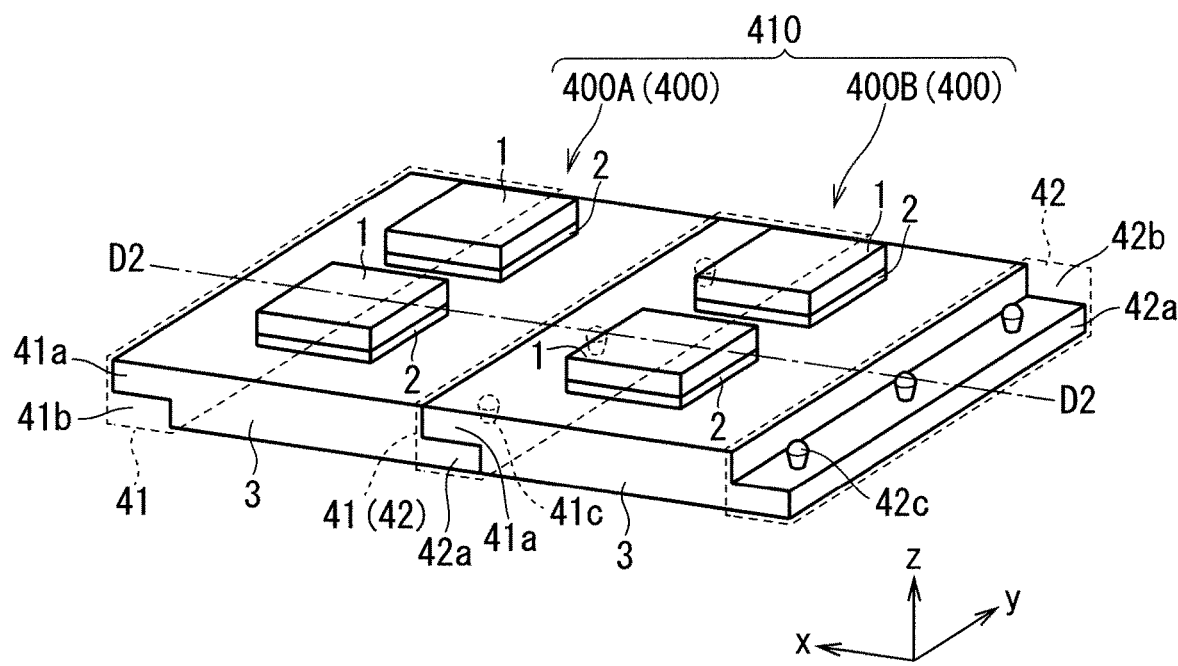
FIG. 17 is a perspective view of a semiconductor device according to the fourth embodiment.
Figure 18:
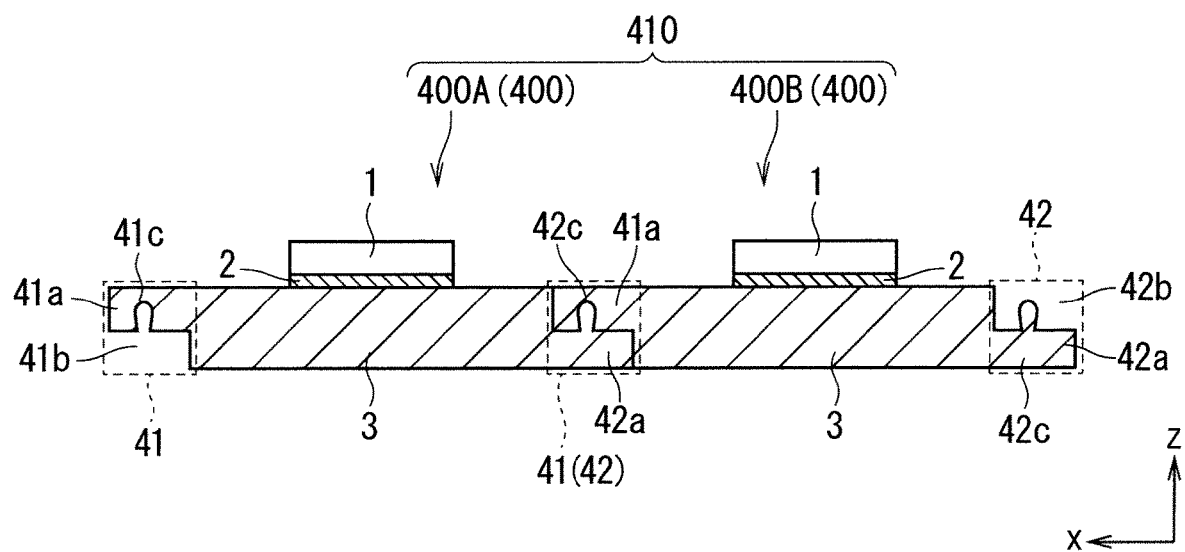
FIG. 18 is a cross-sectional view of the semiconductor device according to the fourth embodiment.

FIG. 17 is a perspective view of a semiconductor device 410 according to the fourth embodiment. FIG. 18 is a cross-sectional view of the semiconductor device 410 taken along line D2-D2 in FIG. 17. As illustrated in FIGS. 17 and 18, the semiconductor device 410 has a configuration in which two semiconductor modules 400 are coupled with each other. For the sake of description, the two semiconductor modules 400 are referred to as semiconductor modules 400A and 400B, respectively, for distinction.

As illustrated in FIGS. 17 and 18, among the semiconductor modules 400A and 400B adjacent to each other, the first side S1 of the semiconductor module 400B is disposed facing to the second side S2 of the semiconductor module 400A. The first joining structure 41 of the semiconductor module 400B and the second joining structure 42 of the semiconductor module 400A are electrically joined with each other by fitting.

In other words, the concave part 41c provided in the first joining structure 41 of the semiconductor module 400B and the convex part 42c provided in the second joining structure 42 of the semiconductor module 400A are fitted to each other. The convex part 42c and the concave part 41c are fitted to each other by pressing the concave part 41c of the semiconductor module 400B in the −z direction toward the convex part 42c of the semiconductor module 400A.

As illustrated in FIGS. 17 and 18, the semiconductor elements 1 can be connected in parallel with each other by electrically joining the lead frames 3 of the semiconductor modules 400A and 400B with each other. Accordingly, the rated current value of the semiconductor device 410 can be changed in accordance with the number of the coupled semiconductor modules 400.

The number of semiconductor modules 400 provided in the semiconductor device 410 is not limited to two. An optional number of semiconductor modules 400 can be coupled with each other in the +x direction and −x direction in accordance with the rated current of the semiconductor device 410.

<Effects>

In the semiconductor module 400 according to the fourth embodiment, the first joining structure 41 includes the concave part 41c recessed in the direction perpendicular to the main surface of the lead frame 3, and the second joining structure 42 includes the convex part 42c protruding in the direction perpendicular to the main surface of the lead frame 3. Assuming that the first joining structure 41 and the second joining structure 42 are overlapped, the concave part 41c and the convex part 42c are fitted to each other.

Accordingly, the first joining structure 41 of one of the semiconductor modules 400 and the second joining structure 42 of the other semiconductor module 400 adjacent thereto can be joined with each other by fitting the concave part 41c and the convex part 42c.

In the semiconductor device 410 according to the fourth embodiment, the first joining structure 41 of one of the semiconductor modules 400 adjacent to each other and the second joining structure 42 of the other of the semiconductor modules 400 adjacent to each other are electrically joined with each other by fitting.

The first joining structure 41 and the second joining structure 42 of the respective semiconductor modules 400 adjacent to each other can be joined with each other by fitting without using a joining member such as solder and a screw.

<Fifth Embodiment>

Figure 19:
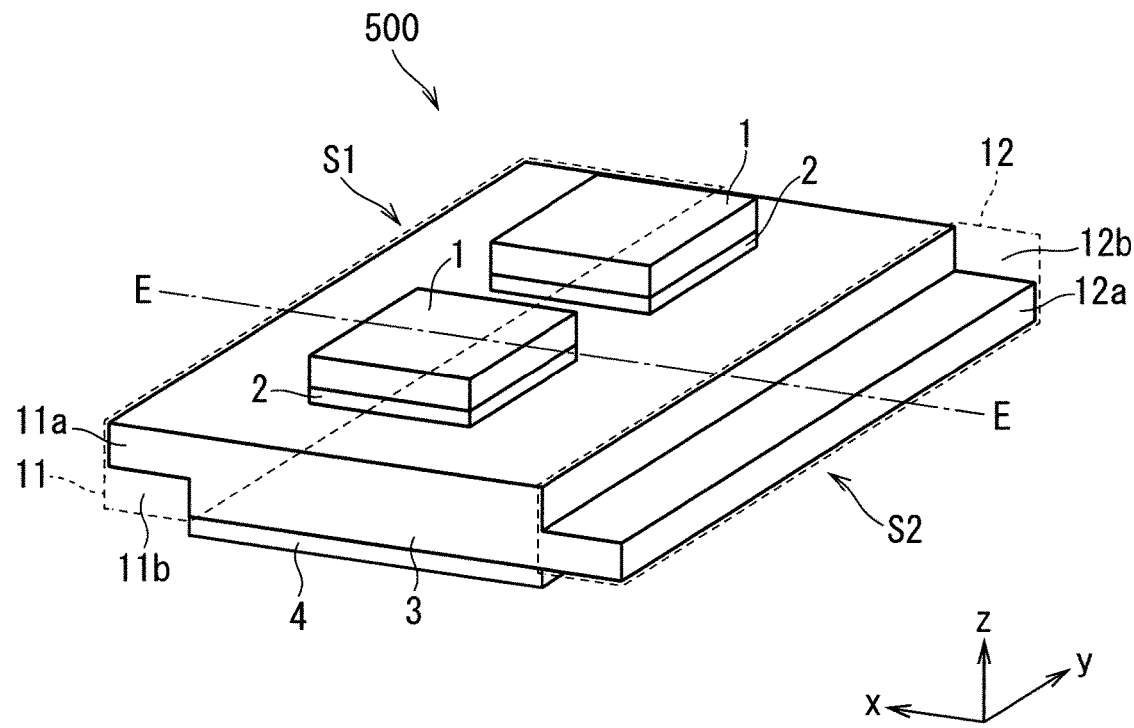
FIG. 19 is a perspective view of a semiconductor module according to a fifth embodiment.
Figure 20:
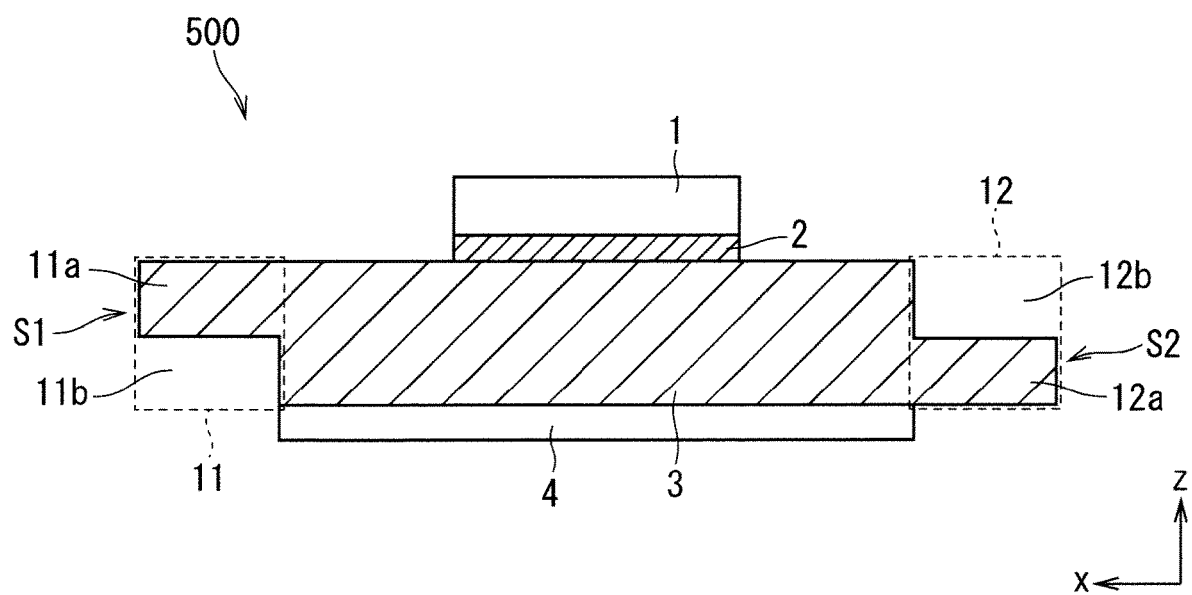
FIG. 20 is a cross-sectional view of the semiconductor module according to the fifth embodiment.

FIG. 19 is a perspective view of a semiconductor module 500 according to a fifth embodiment. FIG. 20 is a cross-sectional view of the semiconductor module 500 taken along line E-E in FIG. 19. The semiconductor module 500 further includes the insulating member 4 in addition to the configuration of the semiconductor module 100 (refer to FIGS. 1 and 2).

The insulating member 4 is flat. The insulating member 4 is made of an organic insulating material or a ceramic insulating material. The insulating member 4 is joined with a surface of the lead frame 3 opposite to the surface joined with the semiconductor element 1.

<Effects>

The semiconductor module 500 according to the fifth embodiment further includes the insulating member 4, and the insulating member 4 is disposed on the surface of the lead frame 3 opposite to the surface joined with the semiconductor element 1.

Accordingly, since the insulating member 4 is disposed on the surface of the lead frame 3 opposite to the surface joined with the semiconductor element 1, the cooler or the like can be insulated from the semiconductor element 1 and the lead frame 3, for example.

<Modification of Fifth Embodiment>

Figure 21:
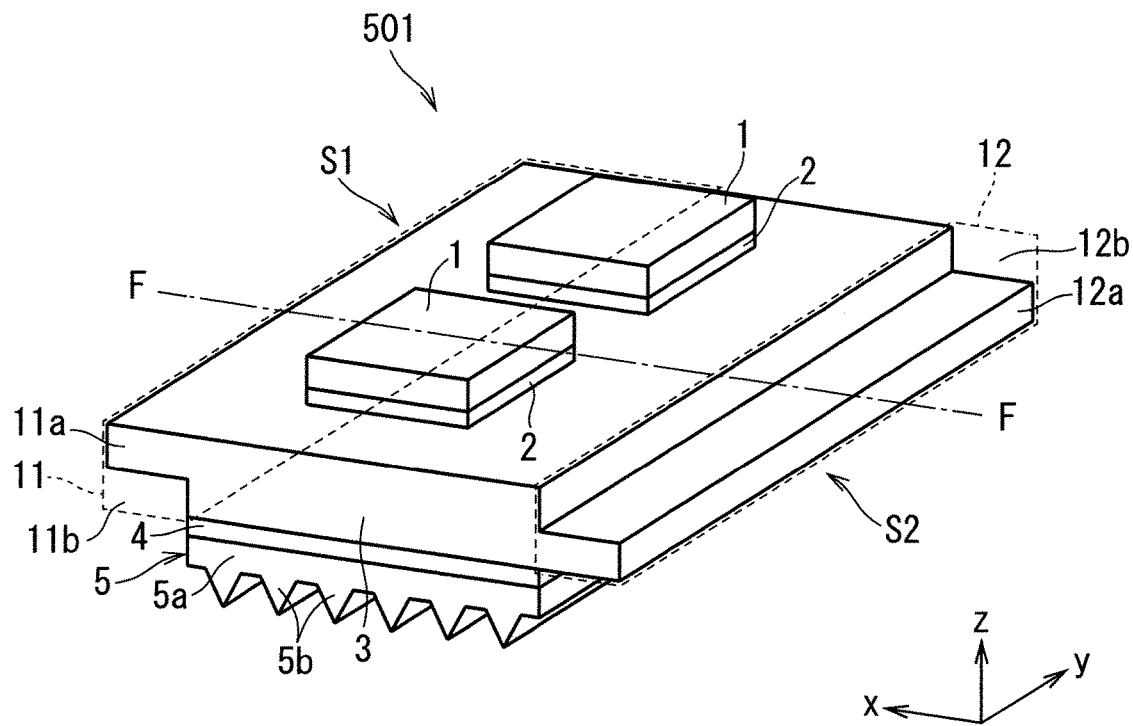
FIG. 21 is a perspective view of a semiconductor module according to a modification of the fifth embodiment.
Figure 22:
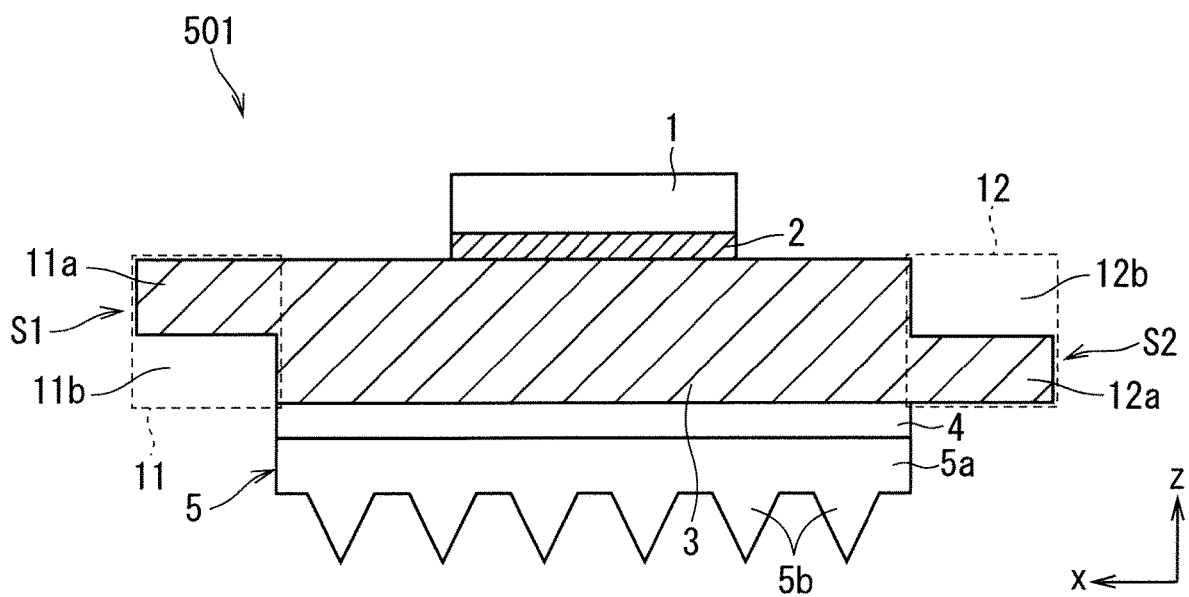
FIG. 22 is a cross-sectional view of the semiconductor module according to the modification of the fifth embodiment.

FIG. 21 is a perspective view of a semiconductor module 501 according to a modification of the fifth embodiment. FIG. 22 is a cross-sectional view of the semiconductor module 501 taken along line F-F of FIG. 21. The semiconductor module 501 further includes the cooler 5 in addition to the configuration of the semiconductor module 500 (refer to FIGS. 19 and 20).

The cooler 5 is joined with a surface of the insulating member 4 opposite to a surface on which the lead frame 3 is disposed. The cooler 5 is formed of a material such as copper, which has excellent thermal conduction. The cooler 5 includes a base plate 5a and a cooling fin 5b.

<Effects>

The semiconductor module 501 according to the modification of the fifth embodiment further includes the cooler 5, and the cooler 5 is joined with the surface of the insulating member 4 opposite to the surface on which the lead frame 3 is disposed.

Accordingly, since the cooler 5 is additionally provided, the semiconductor element 1 and the lead frame 3 can be cooled through the insulating member 4.

<Sixth Embodiment>

Figure 23:
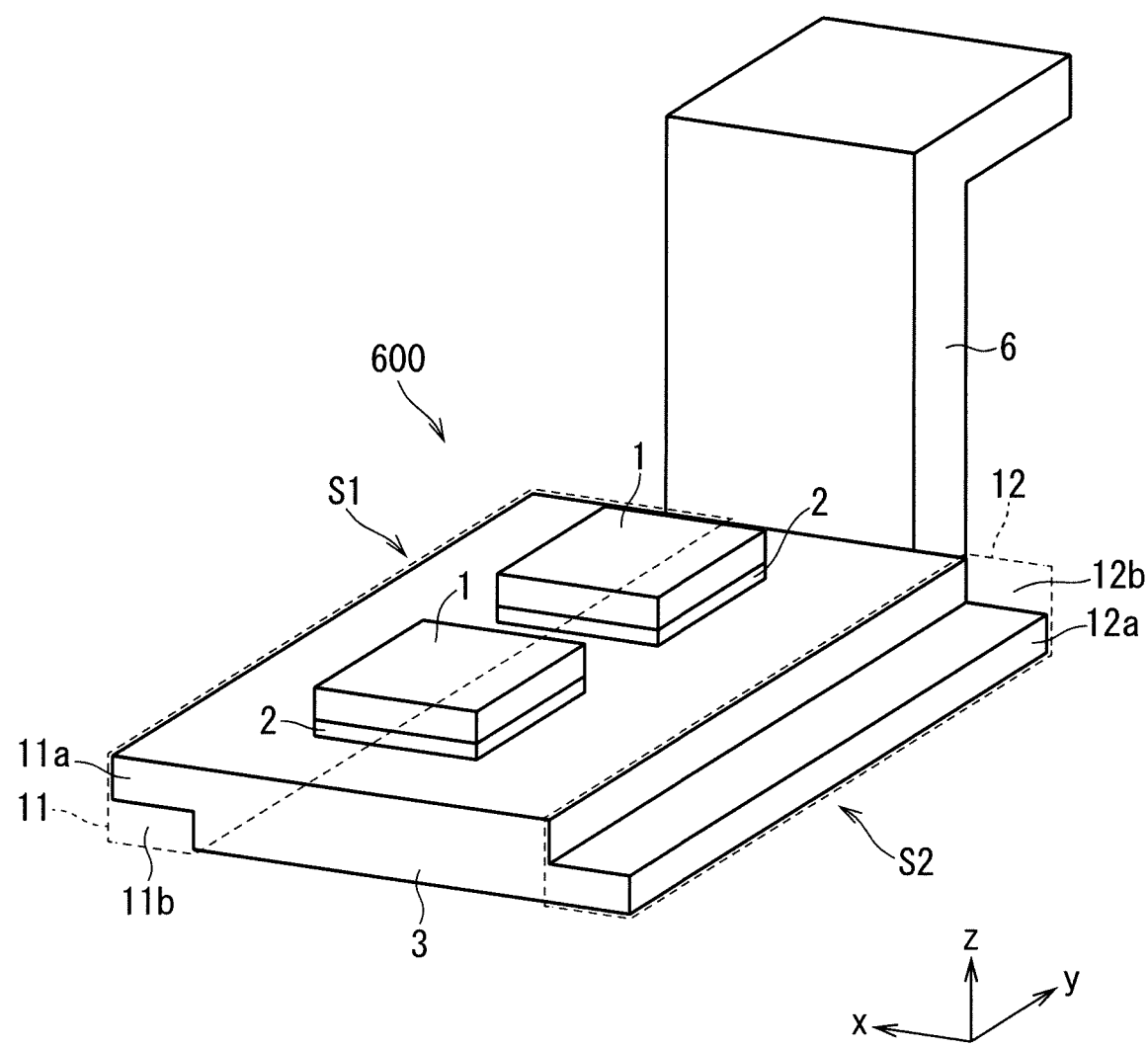
FIG. 23 is a perspective view of a semiconductor module according to a sixth embodiment.

FIG. 23 is a perspective view of a semiconductor module 600 according to a sixth embodiment. The semiconductor module 600 further includes the electrode terminal 6 in addition to the configuration of the semiconductor module 100 (refer to FIGS. 1 and 2). The electrode terminal 6 is electrically joined with the lead frame 3. Accordingly, the electrode terminal 6 is connected with the main electrode of the semiconductor element 1 through the lead frame 3. The electrode terminal 6 is used for electrical connection with the outside of the semiconductor module 600.

The electrode terminal 6 is formed of, for example, the same material as that of the lead frame 3. The shape of the electrode terminal 6 is not limited to the shape illustrated in FIG. 23. The plurality of electrode terminals 6 may be joined with the lead frame 3.

<Effects>

The semiconductor module 600 according to the sixth embodiment further includes the electrode terminal 6, and the electrode terminal 6 is electrically joined with the lead frame 3. Accordingly, the semiconductor module 600 can be electrically connected with the outside through the electrode terminal 6.

<Modification of Sixth Embodiment>

Figure 24:
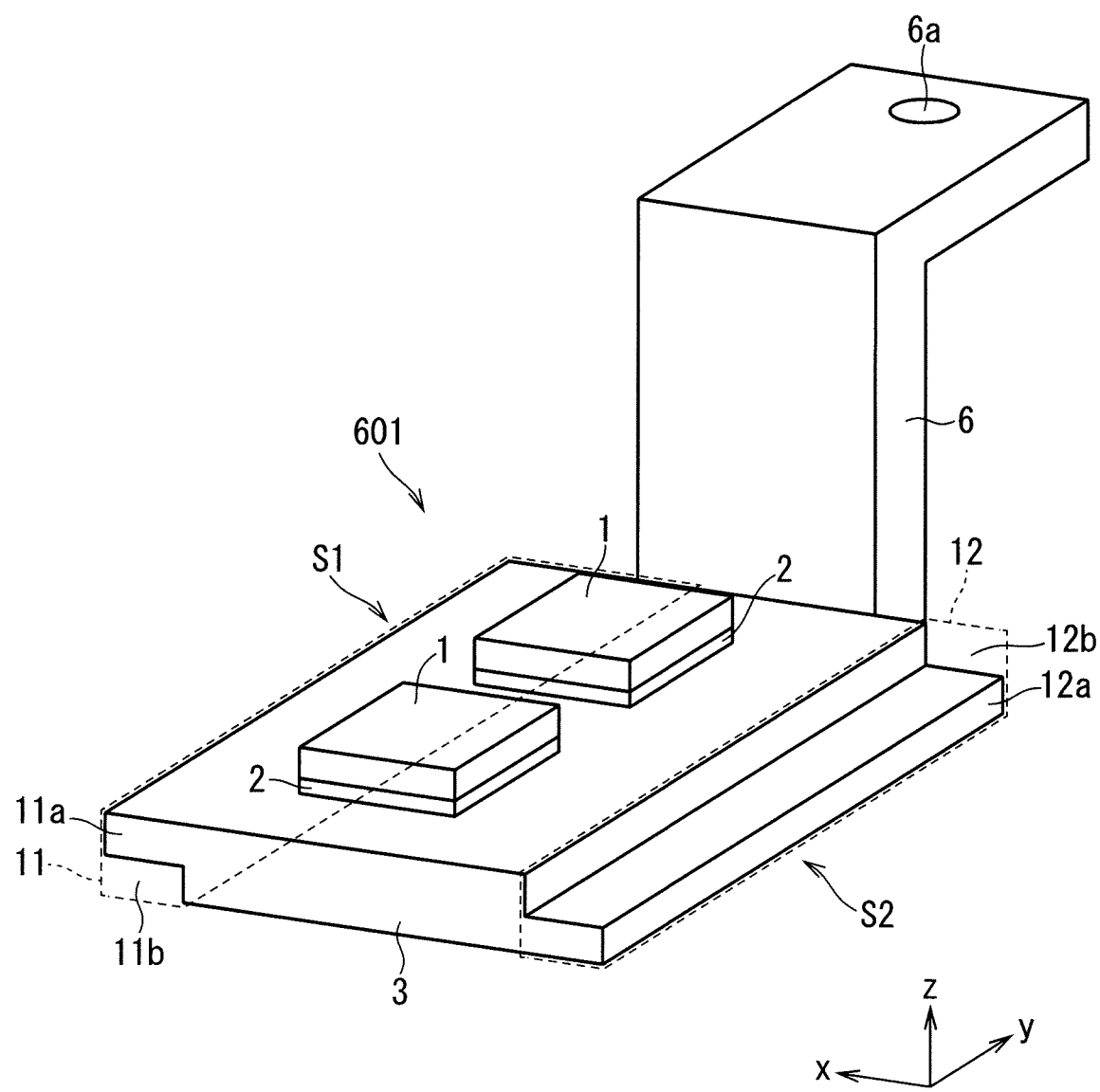
FIG. 24 is a perspective view of a semiconductor module according to a modification of the sixth embodiment.

FIG. 24 is a perspective view of a semiconductor module 601 according to a modification of the sixth embodiment. The semiconductor module 601 includes a hole 6a at a leading end of an electrode terminal 6. The other configurations are the same as those of the semiconductor module 600 (FIG. 23).

The hole 6a provided at the leading end of the electrode terminal 6 is used for connection with an external wire. For example, a female screw is formed inside the hole 6a, and can be screwed with the external wire.

<Effects>

In the semiconductor module 601 according to the modification of the sixth embodiment, the electrode terminal 6 includes the hole 6a for external wire connection at the leading end. Accordingly, the electrode terminal 6 can be easily connected with an external wire by, for example, screwing to the hole 6a.

<Seventh Embodiment>

Figure 25:
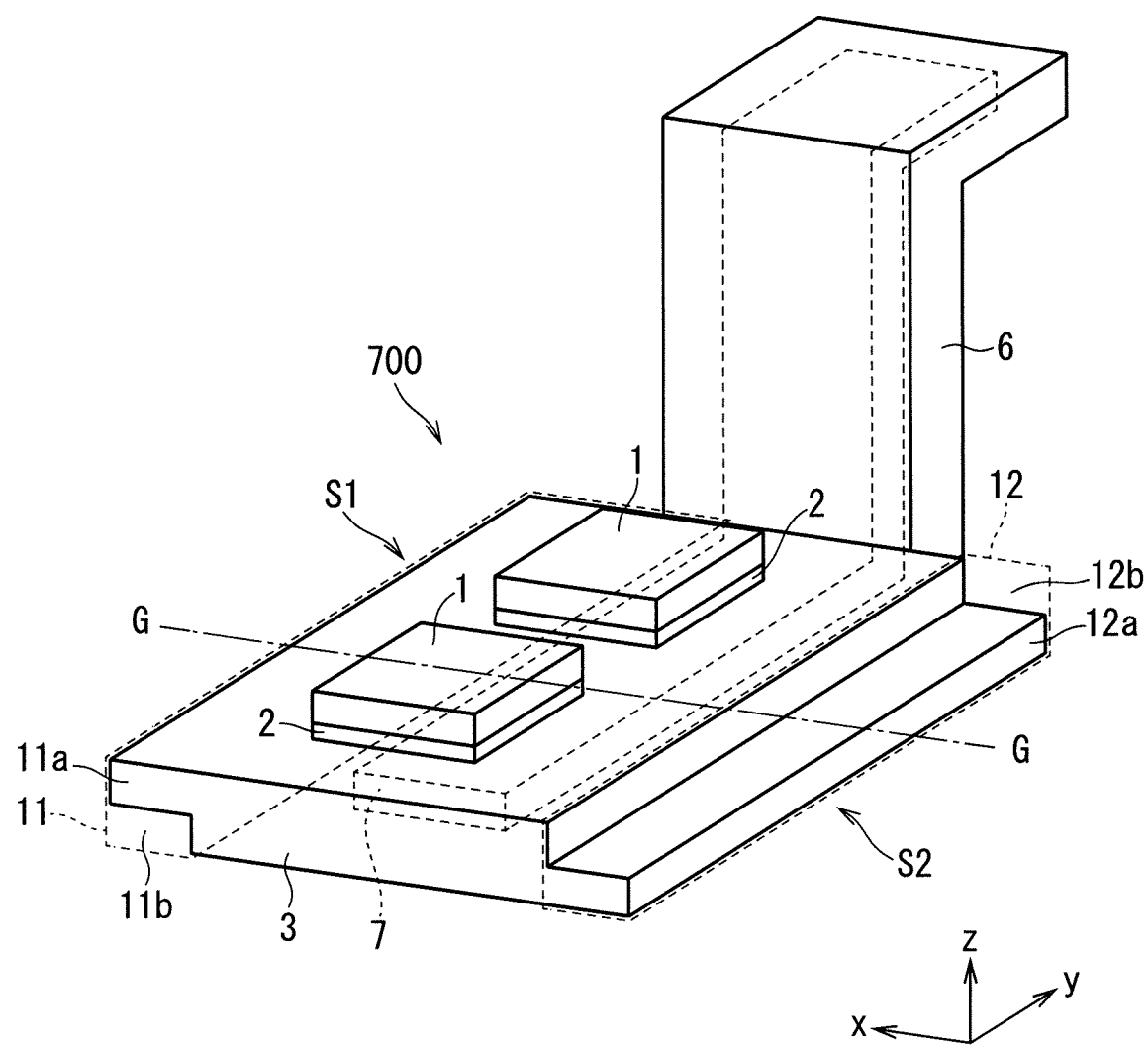
FIG. 25 is a perspective view of a semiconductor module according to a seventh embodiment.
Figure 26:
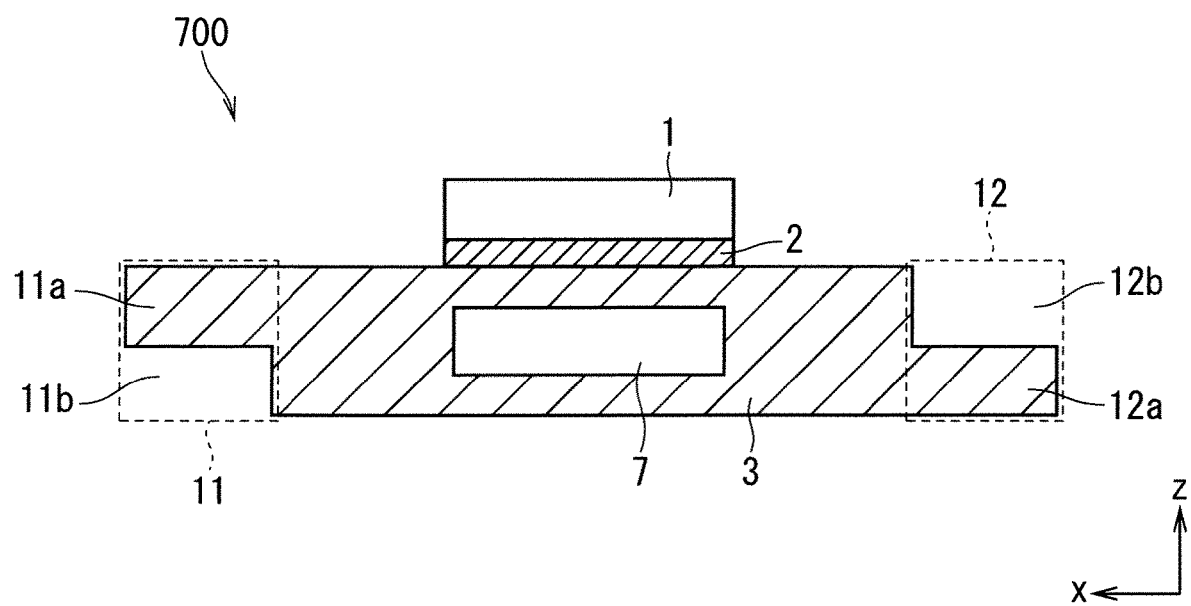
FIG. 26 is a cross-sectional view of the semiconductor module according to the seventh embodiment.

FIG. 25 is a perspective view of a semiconductor module 700 according to a modification of a seventh embodiment. FIG. 26 is a cross-sectional view of the semiconductor module 700 taken along line G-G in FIG. 25. The semiconductor module 700 further includes a heat pipe in addition to the configuration of the semiconductor module 100 (refer to FIGS. 1 and 2).

The heat pipe is incorporated in the lead frame 3 in the semiconductor module 700. Specifically, the lead frame 3 is provided with a cavity 7, and differential liquid is sealed in the cavity 7. As illustrated in FIGS. 25 and 26, the heat pipe incorporated in the lead frame 3 may be extended to the inside of the electrode terminal 6.

<Effects>

In semiconductor module 700 according to the seventh embodiment, the heat pipe is incorporated in the lead frame 3. Since the heat pipe is incorporated in the lead frame 3, the thermal conduction efficiency of the lead frame 3 can be improved.

<Modification of Seventh Embodiment>

Figure 27:
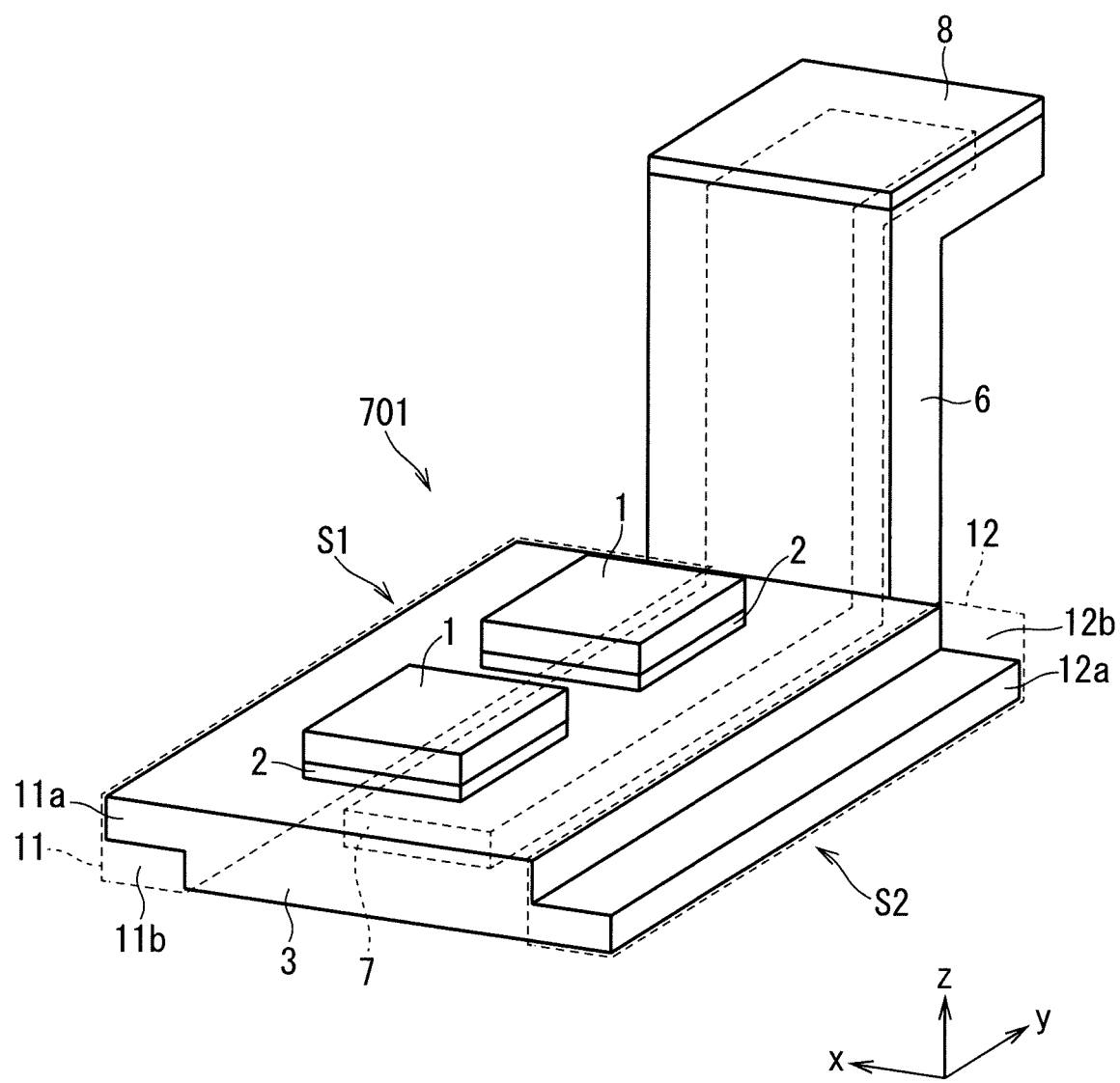
FIG. 27 is a perspective view of a semiconductor module according to a modification of the seventh embodiment.

FIG. 27 is a perspective view of a semiconductor module 701 according to a modification of the seventh embodiment. In the semiconductor module 701, an insulating member 8 is disposed on an upper surface of the leading end of the electrode terminal 6. The other configurations are the same as those of the semiconductor module 700 (FIGS. 25 and 26).

Since the insulating member 8 is disposed on the top surface of the leading end of the electrode terminal 6, the electrode terminal 6 can be cooled by the cooler or the like while insulation from the electrode terminal 6 is maintained. The position at which the insulating member 8 is disposed is not limited to the electrode terminal 6. The insulating member 8 may be disposed at an optional position on the lead frame 3.

<Effects>

In the semiconductor module 701 according to the modification of the seventh embodiment, the heat pipe is incorporated from the lead frame 3 to the electrode terminal 6, and the insulating member 8 is disposed on the electrode terminal 6.

Accordingly, since the insulating member 8 is disposed on the electrode terminal 6, the electrode terminal 6 can be cooled with the cooler or the like while insulation from the electrode terminal 6 is maintained.

<Eighth Embodiment>

Figure 28:
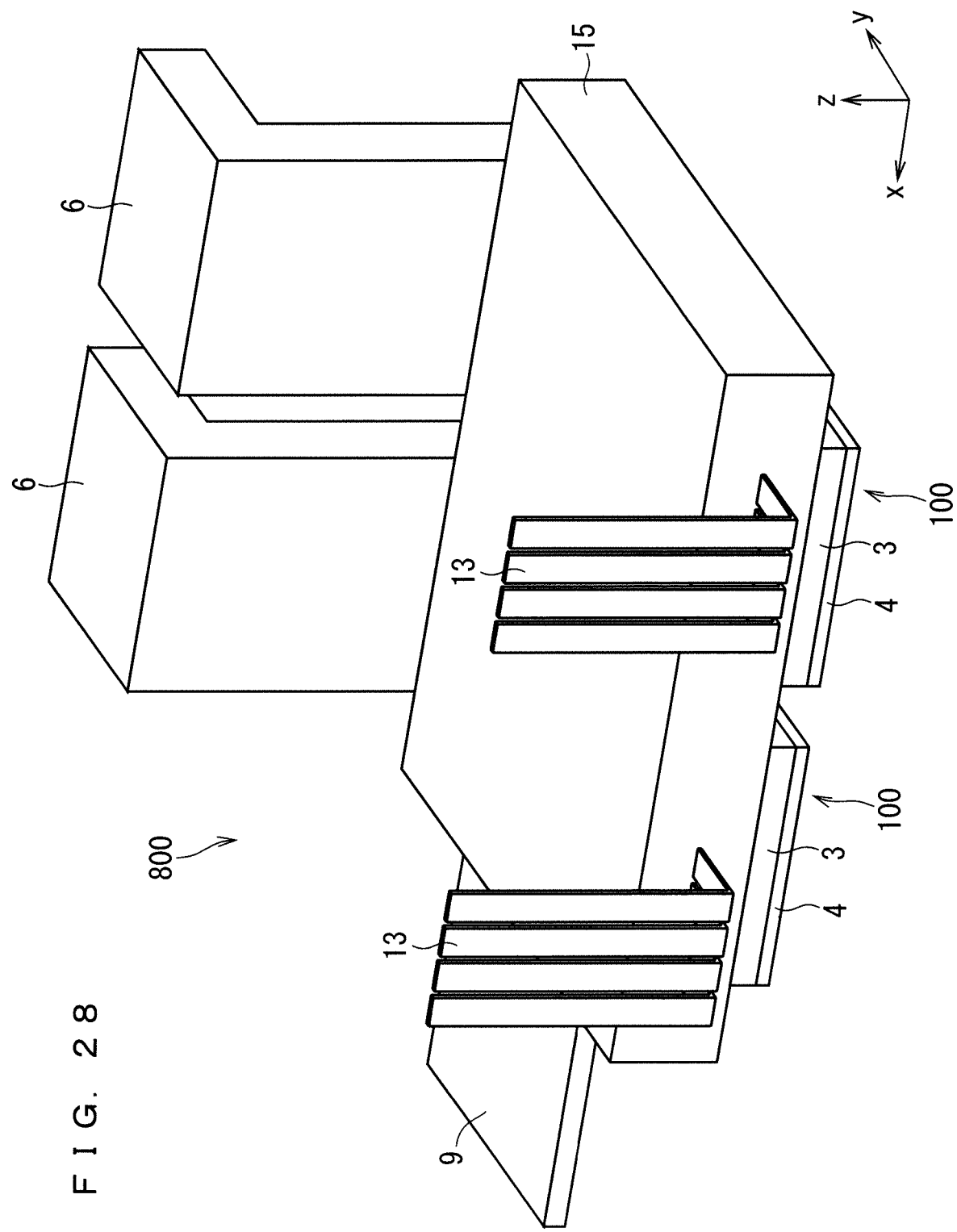
FIG. 28 is a perspective view of a semiconductor device according to an eighth embodiment.
Figure 29:
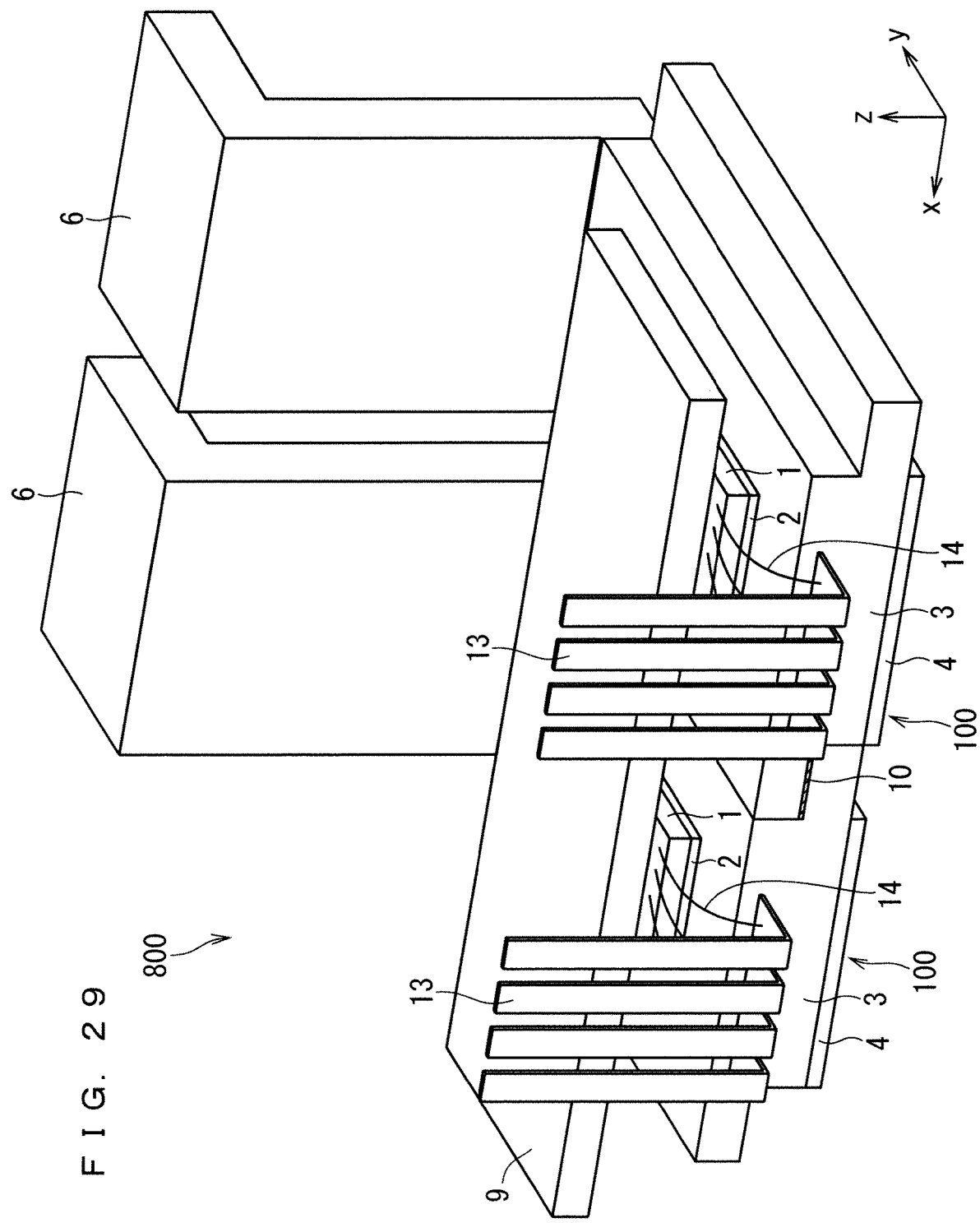
FIG. 29 is a perspective view of an inside of the semiconductor device according to the eighth embodiment.

FIG. 28 is a perspective view of a semiconductor device 800 according to an eighth embodiment. FIG. 29 is a perspective view of an inside of the semiconductor device 800 in a state in which the sealing resin 15 of the semiconductor device 800 is removed.

As illustrated in FIG. 29, the semiconductor device 800 includes two semiconductor modules 100 coupled with each other. The lead frames 3 of the semiconductor modules 100 are each joined with the electrode terminal 6. The main electrode on the upper surface of the semiconductor element 1 provided in each semiconductor module 100 is joined with an electrode terminal 9. The control electrode of the semiconductor element 1 included in each semiconductor module 100 is connected with a control terminal 13 through a wire 14. The insulating member 4 is disposed on the surface of the lead frame 3 of each semiconductor module 100 opposite to the surface on which the semiconductor element 1 is mounted. Further, as illustrated in FIG. 28, in each semiconductor module 100, the surface of the lead frame 3 on which the semiconductor element 1 is mounted and the semiconductor element 1 are sealed by the sealing resin 15.

In the eighth embodiment, the semiconductor device 800 includes the two semiconductor modules 100 coupled with each other. However, the number of the semiconductor modules is not limited to two. Furthermore, instead of the semiconductor modules 100, a plurality of semiconductor modules of any one of the semiconductor modules 200, 300, 400, 500, 600, and 700 may be coupled with each other.

<Effects>

In each of the plurality of semiconductor modules 100 of the semiconductor device 800 according to the eighth embodiment, at least the surface of the lead frame 3 on which the semiconductor element 1 is mounted and the semiconductor element 1 are sealed by resin. When the plurality of semiconductor modules 100 coupled with each other is sealed by resin, the coupling between the plurality of semiconductor modules 100 is enhanced, and the plurality of semiconductor modules 100 can be protected from the external environment.

In each embodiment described above, the semiconductor element 1 may contain a wide-bandgap semiconductor. The wide-bandgap semiconductor is, for example, SiC, GaN, or diamond. When the semiconductor element is formed of such a wide-bandgap semiconductor, a large current can be switched at high temperature even when a plurality of semiconductor modules is coupled with each other to set a large rated current.

The present invention is described above in detail, but the above description is exemplary in any aspect, and the present invention is not limited thereto. It is therefore understood that numerous modifications and variations can be devised without departing from the scope of the present invention.

EXPLANATION OF REFERENCE SIGNS

1: semiconductor element
2, 10: solder
3: lead frame
4, 8: insulating member
5: cooler
6, 9: electrode terminal
6a: hole
7: cavity
7a: differential liquid
13: control terminal
14: wire
15: sealing resin
20: screw
11, 21, 31, 41: first joining structure
12, 22, 32, 42: second joining structure
11a, 12a, 21a, 22a, 31a, 32a, 41a, 42a: substantial part
11b, 12b, 21b, 22b, 31b, 32b, 41b, 42b: void part
21c: through-hole
22c: hole
41c: concave part
42c: convex part
S1: first side
S2: second side
100, 101, 200, 300, 400, 500, 600, 700: semiconductor module
110, 210, 310, 410, 800: semiconductor device

The invention claimed is:

1. A semiconductor module comprising:
a lead frame having a first lead frame surface and a second lead frame surface opposite to the first lead frame surface, the first lead frame surface and the second lead frame surface being separated by a lead frame thickness; and
a semiconductor element joined with the lead frame, wherein the lead frame includes
a first joining structure, and
a second joining structure,
the first joining structure is disposed on a first side of the lead frame,
the second joining structure is disposed on a second side of the lead frame facing to the first side,
the first joining structure includes a first side surface facing the first side of the lead frame and a first transverse surface extending transverse to the first side surface along a direction toward the first side of the lead frame and offset from the first lead frame surface, such that a first distance between the first transverse surface and the second lead frame surface is smaller than the lead frame thickness, and the first side surface and the first transverse surface define a void part as a part at which the lead frame does not exist,
the second joining structure includes a second side surface facing the second side of the lead frame and a second transverse surface extending transverse to the second side surface along a direction toward the second side of the lead frame and offset from the second lead frame surface, such that a second distance between the second transverse surface and the first lead frame surface is smaller than the lead frame thickness, and the second side surface and the second transverse surface define a void part as a part at which the lead frame does not exist, and
each of the first joining structure and the second joining structure has a shape, and the first distance and the second distance are in relation to each other, such that one of the first joining structure and the second joining structure complements all of the void part of the other.

2. The semiconductor module according to claim 1, wherein
the first joining structure includes a through-hole, and
the second joining structure includes a hole.

3. The semiconductor module according to claim 1, wherein
the first joining structure includes a concave part recessed in a direction perpendicular to a main surface of the lead frame, and
the second joining structure includes a convex part protruding in the direction perpendicular to the main surface of the lead frame.

4. The semiconductor module according to claim 1, wherein the lead frame contains copper or aluminum.

5. The semiconductor module according to claim 1, further comprising an insulating member, wherein the insulating member is disposed on a surface of the lead frame opposite to another surface of the lead frame joined with the semiconductor element.

6. The semiconductor module according to claim 5, further comprising a cooler, wherein the cooler is joined with a surface of the insulating member opposite to another surface of the insulating member on which the lead frame is disposed.

7. The semiconductor module according to claim 1, further comprising an electrode terminal, wherein the electrode terminal is electrically joined with the lead frame.

8. The semiconductor module according to claim 7, wherein an external wiring connection hole is provided at a leading end of the electrode terminal.

9. The semiconductor module according to claim 7, wherein
an incorporated heat pipe extends from the lead frame to the electrode terminal, and
an insulating member is disposed at the electrode terminal.

10. The semiconductor module according to claim 1, wherein the lead frame incorporates a heat pipe.

11. The semiconductor module according to claim 1, wherein the semiconductor element includes a wide-bandgap semiconductor.

12. A semiconductor device comprising a plurality of the semiconductor modules according to claim 1, wherein
among the plurality of the semiconductor modules, the first side of one of the semiconductor modules adjacent to each other is disposed facing to the second side of the other of the semiconductor modules adjacent to each other, and
the first joining structure of one of the semiconductor modules adjacent to each other is electrically joined with the second joining structure of the other of the semiconductor modules adjacent to each other.

13. The semiconductor device according to claim 12, wherein the first joining structure of one of the semiconductor modules adjacent to each other is electrically joined with the second joining structure of the other of the semiconductor modules adjacent to each other by soldering.

14. The semiconductor device according to claim 12, wherein the first joining structure of one of the semiconductor modules adjacent to each other is electrically joined with the second joining structure of the other of the semiconductor modules adjacent to each other by screwing.

15. The semiconductor device according to claim 12, wherein the first joining structure of one of the semiconductor modules adjacent to each other is electrically joined with the second joining structure of the other of the semiconductor modules adjacent to each other by fitting.

16. The semiconductor device according to claim 12, wherein in each of the plurality of the semiconductor modules, at least a surface of the lead frame on which the semiconductor element is mounted and the semiconductor element are sealed by resin.

* * * * *